(12) United States Patent
Kondo et al.

(10) Patent No.: US 8,330,545 B2
(45) Date of Patent: Dec. 11, 2012

(54) RF POWER AMPLIFIER

(75) Inventors: Masao Kondo, Tokyo (JP); Yoshikuni Matsunaga, Tokyo (JP); Kenta Seki, Tokyo (JP); Satoshi Sakurai, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/423,327

(22) Filed: Mar. 19, 2012

(65) Prior Publication Data

US 2012/0176197 A1     Jul. 12, 2012

Related U.S. Application Data

(63) Continuation of application No. 13/166,312, filed on Jun. 22, 2011, now Pat. No. 8,154,344, which is a continuation of application No. 12/575,494, filed on Oct. 8, 2009, now Pat. No. 7,990,220.

(30) Foreign Application Priority Data

Nov. 13, 2008    (JP) ................................ 2008-290911

(51) Int. Cl.
     *H03F 3/26*          (2006.01)
(52) U.S. Cl. ...................................................... 330/276
(58) Field of Classification Search .................. 330/195, 330/276

See application file for complete search history.

(56) References Cited

U.S. PATENT DOCUMENTS

| | | |
|---|---|---|
| 5,095,357 A | 3/1992 | Andoh et al. |
| 5,731,740 A | 3/1998 | van de Westerlo |
| 7,576,607 B2 | 8/2009 | Lee et al. |
| 7,777,570 B2 | 8/2010 | Lai |

FOREIGN PATENT DOCUMENTS

JP      03-77360 A      4/1991

OTHER PUBLICATIONS

Haldi, Peter, et al, "A 5.8 GHz Linear Power Amplifier in a Standard 90nm CMOS Process using a 1V Power Supply", IEEE Radio Frequency Integrated Circuits Symposium, 2007, pp. 431-434.
Degani, Ofir, et al, "A 90-nm CMOS Power Amplifier for 802.16e (WiMAX) Applications", IEEE, 2010, pp. 1431-1437.
F.H. Raab et al., RF and Microwave Power Amplifier and Transmitter Technologies—Part 2, High Frequency Electronics, May 2003, pp. 22-36.
W. Simbürger et al., A Monolithic Transformer Coupled 5-W Silicon Power Amplifier with 59% PAE at 0.9 GHz, IEEE Journal of Solid-State Circuits, vol. 34, No. 12, Dec. 1999, pp. 1881-1892.

(Continued)

*Primary Examiner* — Steven J Mottola
(74) *Attorney, Agent, or Firm* — Mattingly & Malur, PC

(57) ABSTRACT

A reduction is achieved in the primary-side input impedance of a transformer (voltage transformer) as an output matching circuit without involving a reduction in Q-factor. An RF power amplifier includes transistors, and a transformer as the output matching circuit. The transformer has a primary coil and a secondary coil which are magnetically coupled to each other. To the input terminals of the transistors, respective input signals are supplied. The primary coil is coupled to each of the output terminals of the transistors. From the secondary coil, an output signal is generated. The primary coil includes a first coil and a second coil which are coupled in parallel between the respective output terminals of the transistors, and each magnetically coupled to the secondary coil. By the parallel coupling of the first and second coils of the primary coil, the input impedance of the primary coil is reduced.

26 Claims, 18 Drawing Sheets

OTHER PUBLICATIONS

I. Aoki et al., Fully Integrated CMOS Power Amplifier Design Using the Distributed Active-Transformer Architecture, IEEE Journal of Solid-State Circuits, vol. 37, No. 3, Mar. 2002, pp. 371-383.

K.H. An et al., A Monolithic Voltage-Boosting Parallel-Primary Transformer Structures for Fully Integrated CMOS Power Amplifier Design, 2007 IEEE Radio Frequency Integrated Circuits Symposium, Jun. 3-5, 2007, pp. 419-422.

P. Haldi et al., "CMOS compatible transformer power combiner", Electronics Letters, USA, IEEE, Sep. 14, 2006, vol. 42 No. 19.

D. Gruner et al., "6GHz SiGe Power Amplifier with On-Chip Transformer Combing", International Microwave and Optoelectronics Conference, 2007, USA, IEEE, pp. 790-794.

A. Heinz et al., "A Monolithic 2.8V, 3.2W Silicon Bipolar Power Amplifier with 54% PAE at 900MHz", Radio Frequency Integrated Circuits Symposium, 2000, Digest of Papers, USA, IEEE, pp. 117-120.

RF POWER AMPLIFIER

CROSS-REFERENCE TO RELATED APPLICATIONS

This application is a continuation application of U.S. Ser. No. 13/166,312, filed Jun. 22, 2011 (now U.S. Pat. No. 8,154,344), which is a continuation application of U.S. Ser. No. 12/575,494, filed Oct. 8, 2009 now U.S. Pat. No. 7,990,220, the entire disclosures of which are hereby incorporated by reference.

The disclosure of Japanese Patent Application No. 2008-290911 filed on Nov. 13, 2008 including the specification, drawings and abstract is incorporated herein by reference in its entirety.

BACKGROUND OF THE INVENTION

The present invention relates to RF power amplifiers, and particularly to a technology which is effective in reducing the input impedance of a primary coil in a transformer of an impedance matching circuit without involving a reduction in Q-factor.

As has been well known, in a radio-frequency (RF) power amplifier mounted in a communication device such as a mobile phone terminal device or a wireless LAN terminal, an impedance matching circuit is coupled between a source-grounded or emitter-grounded power amplification transistor and a load for the purpose of efficiently driving the antenna of the load with the power amplification transistor. The impedance matching circuit transforms a low output impedance of several ohms of the power amplification transistor to a high input impedance of typically 50 ohms of the load. The impedance matching circuit is formed of passive elements which are a coil and a capacitor, and can be formed of a voltage transformer (transformer) having no loss and a predetermined transformation ratio. The primary coil of the transformer is coupled to the drain or collector of the power amplification transistor, while the secondary coil of the transformer is coupled to the antenna of the load.

In Non-Patent Document 1 listed below, a high-efficiency class-B push-pull power amplifier is described in which, in an impedance matching circuit using a transformer, one end and the other end of the primary coil of the transformer are coupled to a pair of N-channel MOS transistors driven by a complementary pair of input signals. To the midpoint of the primary coil, a drain power supply voltage is supplied, and the secondary coil of the transformer is coupled to a load.

In Non-Patent Document 2 listed below, a monolithic RF power amplifier is described in which a first on-chip transformer as an input balun, second and third on-chip transformers as a driver stage and an inter-stage matching circuit, and a power output stage are integrated on a silicon chip. The driver stage includes a pair of driver transistors that are driven by respective signals from both ends of the secondary coil of the first on-chip transformer. The power output stage includes a pair of output transistors that are driven by respective signals from both ends of the secondary coils of the second and third on-chip voltage transformers. To each of the collectors of the pair of driver transistors, a power supply voltage is supplied via the primary coil of each of the second and third on-chip transformers. The three on-chip transformers are each formed of three-layer wiring over the silicon chip. To each of the collectors of the pair of driver transistors in the driver stage, an output matching circuit formed of a plurality of coils and a plurality of capacitors which are external members of the silicon chip is coupled.

In Non-Patent Document 3 listed below, there is described a power amplifier for solving a problem associated with the output matching circuit formed of the external members of the monolithic RF power amplifier described in Non-Patent document 2 listed below, and also solving the problems of low breakdown voltage and heat dissipation of a short-channel MOS transistor. The power amplifier is called a distributed active-transformer (DAT) power amplifier by the authors of Non-Patent document 3. The primary coil of the distributed active-transformer (DAT) is formed of a plurality of slab inductors arranged in an annular configuration, and each having a high Q-factor. Between the plurality of inductors, differential push-pull amplifiers each including a pair of N-channel MOS transistors driven by a complementary pair of input signals are coupled. In the primary coil of the distributed active-transformer (DAT), the plurality of inductors and the plurality of differential push-pull amplifiers are alternately arranged along the annular configuration. The secondary coil of the distributed active-transformer (DAT) is formed of a 1-turn metal strip inside the primary coil having the annular shape. Since the plurality of differential push-pull amplifiers of the primary coil allow flows of identical synchronized alternating currents, a magnetic field is induced in the secondary coil so that the sum of the differential voltages of the plurality of differential push-pull amplifiers is generated. As mentioned above, DAT is the abbreviation of the distributed active-transformer.

The DAT power amplifier described in Non-Patent Document 3 listed below also includes, in order to supply the complementary pair of input signals to the respective gates of each of the MOS transistors of the plurality of differential push-pull amplifiers, differential signal lines for supplying a balanced signal from the outside of the annular shape to the center portion of the annular shape in order to supply the complementary pair of input signals to the respective gates of the pair of MOS transistors of each of the plurality of differential push-pull amplifiers. Between the center portion and each of the respective gates of the pair of MOS transistors, a distribution circuit for symmetrical coupling is disposed. Note that, since the primary coil having the annular shape of the distributed active-transformer (DAT) is formed of the plurality of slab inductors each having a linear shape, each of the slab inductors has a Q-factor higher than that of a typical spiral inductor in which a negative mutual inductance is generated by current flowing in opposing wires.

In Non-Patent Document 4 listed below, it is stated that the circular structure of a distributed active-transformer (DAT) of a DAT power amplifier as described in Non-Patent Document 3 listed below serves as a factor causing cross coupling of an input and an output of power which destabilizes the amplifier. In Non-Patent Document 4 listed below, it is also stated that the power coupling structure of the distributed active-transformer (DAT), which is rather large compared with active devices, determines the total chip size, and hence is not desirable in terms of cost. Therefore, in Non-Patent Document 4 listed below, in order to reduce the linking of the input and the output for the sake of stability, input ports coupled to power devices are disposed at the portion of the primary coil corresponding to one side of the quadrilateral of the distributed active-transformer (DAT), while the output port of the secondary coil of the distributed active-transformer (DAT) is disposed at the opposite side of the quadrilateral thereof.

Non-Patent Document 1

Frederic H. Raab et al, "RF and Microwave Power Amplifier and Transmitter Technologies-Part 2", High Frequency Electronics, PP. 22-36, May 2003.

Non-Patent Document 2

Werner Simburger et al., "A Monolithic Transformer Coupled 5-W Silicon Power Amplifier with 59% PAE at 0.9 GHz", IEEE JOURNAL OF SOLID-STATE CIRCUITS, VOL. 34, NO. 12 DECEMBER 1999, PP. 1881-1892.

Non-Patent Document 3

Ichiro Aoki et al., "Fully Integrated CMOS Power Amplifier Design Using the Distributed Active-Transformer Architecture", IEEE JOURNAL OF SOLID-STATE CIRCUITS, VOL. 37, NO. 3, March 2002, PP. 371-383.

Non-Patent Document 4

Kyu Hwan An et al, "A Monolithic Voltage-Boosting Parallel-Primary Transformer Structures for Fully Integrated CMOS Power Amplifier Design", 3 to 5 Jun. 2007, 2007 IEEE Radio Frequency Integrated Circuits Symposium, PP. 419 to 422.

SUMMARY OF THE INVENTION

Prior to the present invention, the present inventors undertook the development of an RF power amplifier using a voltage transformer (transformer) having no loss and a predetermined transformation ratio as an output impedance matching circuit. Because the RF power amplifier was to be mounted in a mobile phone terminal device, the development task of achieving a size reduction and low cost was given to the present inventors.

In the process of the development, the present inventors first conducted a detailed examination of the background technology.

FIG. 1 shows the power amplifier examined by the present inventors based on the DAT power amplifier described in Non-Patent Document 3 listed above prior to the present invention. The power amplifier uses a transformer formed on a silicon (Si) chip (on-chip transformer). The transformer is a device which performs energy transfer between a plurality of wires placed in generally parallel and proximate relation using electromagnetic induction. The power amplifier shown in the plan view of FIG. 1 includes one transformer and a plurality of transistors each formed on one Si chip, and performs power combining and impedance matching for output power using the transformer.

The power amplifier uses, as active devices, eight source-grounded N-channel MOS transistors 7A to 7H that can be manufactured by a CMOS manufacturing process. The respective input terminals, output terminals, and ground terminals of the individual transistors serve as the respective gates, drains, and sources thereof. As an output matching circuit and a power combining circuit, an on-chip transformer is used which includes a plurality of (four) metal wires 1A to 1D as a primary coil having an annular shape, and a metal thin-film wire 2 as a 1-turn metal strip of a secondary coil inside the primary coil. Between the first metal wire 1A and the second metal wire 1B, a first push-pull power amplification circuit including the pair of N-channel MOS transistors 7A and 7B and a capacitor 4A is coupled. To the respective gates of the transistors 7A and 7B, a non-inverted input signal +Input and an inverted input signal −Input are supplied respectively. Between the second metal wire 1B and the third metal wire 1C, a second push-pull power amplification circuit including the pair of N-channel MOS transistors 7C and 7D and a capacitor 4B is coupled. Between the third metal wire 1C and the fourth metal wire 1D, a third push-pull power amplification circuit including the pair of N-channel MOS transistors 7E and 7F and a capacitor 4C is coupled. Finally, between the fourth metal wire 1D and the first metal wire 1A, a fourth push-pull power amplification circuit including the pair of N-channel MOS transistors 7G and 7H and a capacitor 4D is coupled. The four metal wires 1A to 1D as the primary coil having the annular shape are formed of a plurality of slab inductors each having a high Q-factor, and a drain power supply voltage Vdd is supplied to each of the midpoints thereof. From the both ends of the metal thin-film wire 2 as the 1-turn metal strip of the secondary coil inside the primary coil, an output signal Output is generated, and a capacitor 4E is coupled to the both ends. Note that the capacitors 4A to 4D are for reducing the levels of odd-numbered harmonics in the push-pull power amplification circuits.

In the power amplifier shown in the plan view of FIG. 1, the four slab inductors as the primary coil having the annular shape and the four push-pull power amplification circuits are alternately arranged in an annular configuration, and the primary coil and the secondary coil 2 having the annular shape are disposed adjacent to each other, and magnetically coupled. As a result, the outputs of the four push-pull power amplification circuits are power-combined by the on-chip transformer, and output matching can be performed. In addition, the problem of low breakdown voltage and heat dissipation of a short-channel MOS transistor can be solved. Further, there is achieved an effect of allowing compact formation of the output matching circuit of the power amplifier on the Si chip, and thereby allowing significant reductions in the manufacturing cost and size of the power amplifier. Furthermore, since the pair of MOS transistors of each of the push-pull power amplification circuits perform differential operations, the currents in the pair of MOS transistors are cancelled out to stabilize source voltages, and also stabilize the drain power supply voltage Vdd at each of the midpoints of the four slab metal wires 1A to 1D. Consequently, there is also achieved an effect of eliminating the need for large capacitors for voltage stabilization, and allowing reductions in the manufacturing cost and size of the power amplifier.

FIG. 2 also shows another power amplifier examined by the present inventors based on the DAT power amplifier described in Non-Patent Document 3 listed above prior to the present invention. The power amplifier shown in FIG. 2 is different from the power amplifier shown in FIG. 1 in the following point. That is, in the power amplifier shown in FIG. 2, eight metal wires 1A to 1H as a primary coil having an outer annular shape are arranged outside the secondary coil 2 having the annular shape of the on-chip transformer, and four metal wires 1I to 1L are arranged as a primary coil having an inner annular shape inside the secondary coil 2. Between the outer metal wire 1A and the outer metal wire 1B, a push-pull power amplification circuit including a pair of N-channel MOS transistors 3A and 3B and the capacitor 4A is coupled. To the respective gates of the transistors 3A and 3B, the non-inverted input signal +Input and the inverted input signal −Input are supplied respectively. Between the outer metal wire 1C and the outer metal wire 1D, a push-pull power amplification circuit including a pair of N-channel MOS transistors 3C and 3D and the capacitor 4B is coupled. Between the outer metal wire 1E and the outer metal wire 1F, a push-pull power amplification circuit including a pair of N-channel MOS transistors 3E and 3F and the capacitor 4C is coupled. Finally, between the outer metal wire 1G and the outer metal wire 1H, a push-pull power amplification circuit including a pair of N-channel MOS transistors 3G and 3H and the capacitor 4D is coupled.

To the midpoint of the inner metal wire 1L located above and rightward of the center portion of the annular shape, the drain power supply voltage Vdd is supplied. The inner metal wire 1L has at the upper left one end thereof which is coupled to the drain of the N-channel MOS transistor 3A via a bonding wire 8A and the outer metal wire 1A, and the lower right other end thereof which is coupled to the drain of the N-channel MOS transistor 3F via a bonding wire 8H and the outer metal wire 1F. To the midpoint of the inner metal wire 1I located above and leftward of the center portion of the annular shape also, the drain power supply voltage Vdd is supplied. The inner metal wire 1I has at the lower left one end thereof which is coupled to the drain of the N-channel MOS transistor 3C via a bonding wire 8C and the outer metal wire 1C, and the upper right other end thereof which is coupled to the drain of the N-channel MOS transistor 3H via a bonding wire 8B and the outer metal wire 1H. To the midpoint of the inner metal wire 1J located below and leftward of the center portion of the annular shape also, the drain power supply voltage Vdd is supplied. The inner metal wire 1J has at the lower right one end thereof which is coupled to the drain of the N-channel MOS transistor 3E via a bonding wire 8E and the outer metal wire 1E, and the upper left other end thereof which is coupled to the drain of the N-channel MOS transistor 3B via a bonding wire 8D and the outer metal wire 1B. To the midpoint of the inner metal wire 1K located below and rightward of the center portion of the annular shape, the drain power supply voltage Vdd is supplied. The inner metal wire 1K has at the upper right one end thereof which is coupled to the drain of the N-channel MOS transistor 3G via a bonding wire 8G and the outer metal wire 1G, and the lower left other end thereof which is coupled to the drain of the N-channel MOS transistor 3D via a bonding wire 8F and the outer metal wire 1D.

FIG. 3 also shows still another power amplifier examined by the present inventors based on the DAT power amplifier described in Non-Patent Document 3 listed above prior to the present invention. The power amplifier shown in FIG. 3 is different from the power amplifier shown in FIG. 2 in that the number of the metal wires of the primary coil each located outside the secondary coil 2 and having an outer annular shape, and the number of the metal wires of the primary coil each located inside the secondary coil 2 and having an inner annular shape have been each reduced to one-half, and the number of the push-pull power amplification circuits has been also reduced to one-half. That is, in the power amplifier shown in FIG. 3, the four metal wires 1A to 1D as the primary coil each having the outer annular shape are arranged outside the secondary coil 2 having the annular shape of the on-chip transformer, and the two metal wires 1E and 1F as the primary coil each having the inner annular shape are arranged inside the secondary coil 2.

To the midpoint of the inner metal wire 1E located over the center portion of the annular shape, the drain power supply voltage Vdd is supplied. The inner metal wire 1E has at the lower left one end thereof which is coupled to the drain of the N-channel MOS transistor 3C via the bonding wire 8A and the outer metal wire 1B, and the lower right other end thereof which is coupled to the drain of the N-channel MOS transistor 3D via the bonding wire 8D and the outer metal wire 1C. To the midpoint of the inner metal wire 1F located under the center portion of the annular shape also, the drain power supply voltage Vdd is supplied. The inner metal wire 1F has at the upper right one end thereof which is coupled to the drain of the N-channel MOS transistor 3B via the bonding wire 8C and the outer metal wire 1D, and the upper left other end thereof which is coupled to the drain of the N-channel MOS transistor 3A via the bonding wire 8B and the outer metal wire 1A.

It has been revealed that the power amplifiers examined by the present inventors prior to the present invention, and shown in FIGS. 2 and 3 have problems as described below. That is, as described in Non-Patent Document 4 listed above, the annular shape of each of the on-chip transformers shown in FIGS. 2 and 3 serves as a factor causing cross coupling of the input and output of power which destabilizes the amplifiers. Specifically, in the power amplifier shown in FIG. 2, the following is required to supply the complementary pair of input signals +Input and −Input in parallel to the respective gates of the plurality of pairs of MOS transistors 3A, 3B, . . . 3G, and 3H of the plurality of differential push-pull amplifiers. First, differential signal lines for supplying a balanced signal of the complementary pair of input signals +Input and −Input from the outside of the metal wires 1A and 1B, . . . 1G, and 1H as the primary coil each having the outer annular shape to the center portion of the annular shape are required. Next, the distribution circuits having a plurality of symmetrical coupled wires are required between the center portion of the annular shape and the respective gates of the plurality of pairs of MOS transistors 3A, 3B, . . . 3G, and 3H. However, the differential signal lines for supplying the balanced signal of the complementary pair of input signals +Input and −Input from the outside of the annular shape to the center portion of the annular shape in the inside thereof form cross wires with the secondary coil 2 having the annular shape so that signal loss occurs at the portions of the cross wires. In addition, the plurality of symmetrically coupled wires of the distribution circuits which are coupled to the center portion of the annular shape and to the respective gates of the plurality of pairs of MOS transistors also form cross wires with the secondary coil 2 having the annular shape so that signal loss occurs at the portions of the cross wires. As a result of simulation performed by the present inventors, it has been proved that the loss reduces power added efficiency (PAE) by 5%.

Further in the power amplifier shown in FIG. 2, it is necessary to form the on-chip transformer and the plurality of MOS transistors 3A, 3B, . . . 3G, and 3H of the plurality of differential push-pull amplifiers on the same Si chip. Compared with the chip area occupied by the MOS transistors 3A, 3B, . . . 3G, and 3H, the chip area occupied by the on-chip transformer having the annular shape increases to increase the manufacturing cost of the power amplifier. Furthermore, the problems of the deterioration of the power added efficiency due to the loss and high manufacturing cost cannot be circumvented even with the power amplifier shown in FIG. 3.

FIG. 4 shows a power amplifier examined by the present inventors based on the DAT power amplifier described in Non-Patent Document 4 listed above prior to the present invention. In the power amplifier shown in FIG. 4, in order to reduce the coupling between the input and output for the sake of stability, the input ports coupled to the power devices are disposed in the primary coil at the lower side of the quadrilateral of the transformer, while the output port of the secondary coil of the transformer is disposed at the upper opposite side of the quadrilateral thereof. The secondary coil having the annular shape of the transformer includes an outer secondary coil 2A and an inner secondary coil 2B. One end of the outer secondary coil 2A which is located leftward of the middle of the upper side of the quadrilateral is coupled to an output terminal Output, while the other end thereof which is located rightward of the middle of the upper side of the quadrilateral is coupled to one end of the inner secondary coil 2B which is located leftward of the middle of the upper side of the quadrilateral via a lower-layer cross wire 5H. The other end of the inner secondary coil 2B which is located rightward of the middle of the upper side of the quadrilateral is coupled to a ground voltage GND via a lower-layer cross wire 5D.

The first primary coil having the annular shape of the transformer includes the metal wire 1A as a long-distance wire extending in protruding relation to form the left side of the quadrilateral, a lower-layer cross wire 5F located at the middle of the lower side of the quadrilateral, and the metal wire 1B as a short-distance wire located leftward of the middle of the lower side of the quadrilateral. That is, one end of the metal wire 1A as the long-distance wire extending in protruding relation to form the left side of the quadrilateral which is located rightward of the middle of the lower side of the quadrilateral and one end of the metal wire 1B as the short-distance wire which is located leftward of the middle of the lower side of the quadrilateral are coupled to each other via the lower-layer cross wire 5F. The other end of the metal wire 1B as the short-distance wire is coupled to the drain of the N-channel MOS transistor 7B, while the other end of the metal wire 1A as the long-distance wire which is located leftward of the middle of the lower side of the quadrilateral is coupled to the drain of the N-channel MOS transistor 7A. The second primary coil having the annular shape of the transformer includes the metal wire 1D as a long-distance wire extending in protruding relation to form the right side of the quadrilateral, a lower-layer cross wire 5G located at the middle of the upper side of the quadrilateral, the metal wire 1C as a long-distance wire located in an inner left portion of the quadrilateral, a lower-layer cross wire 5E located at the middle of the lower side of the quadrilateral, and the metal wire 1E as a short-distance wire located rightward of the middle of the lower side of the quadrilateral. That is, one end of the metal wire 1D as the long-distance wire extending in protruding relation to form the right side of the quadrilateral which is located rightward of the middle of the lower side of the quadrilateral is coupled to the drain of the N-channel MOS transistor 7D, while the other end of the metal wire 1D as the long-distance wire which is located rightward of the middle of the upper side of the quadrilateral is coupled to one end of the metal wire 1C as the long-distance wire located in the inner left portion of the quadrilateral which is located leftward of the middle of the upper side of the quadrilateral via the lower-layer cross wire 5G. The other end of the metal wire 1C as the long-distance wire which is located leftward of the middle of the lower side of the quadrilateral is coupled to the drain of the N-channel MOS transistor 7C via the lower-layer cross wire 5E located at the middle of the lower side of the quadrilateral and via the metal wire 1E as the short-distance wire located rightward of the middle of the lower side of the quadrilateral. To the respective drains of the N-channel MOS transistors 7A, 7B, 7C, and 7D, the drain power supply voltage Vdd is supplied via bonding wires 9A, 9B, 9C, and 9D.

In the power amplifier shown in FIG. 4, gate complementary input signal wires for supplying the complementary pair of input signals +Input and −Input to the respective gates of the plurality of MOS transistors 7A, 7B, 7C, and 7D need not form cross wires with the outer secondary coil 2A and the inner secondary coil 2B of the transformer. Also, the gate complementary input signal wires of the MOS transistors 7A . . . 7D need not form cross wires with the bonding wires 9A . . . 9D in accordance with the device layout of the Si chip. Therefore, in the power amplifier shown in FIG. 4, it is possible to solve the problem of instability due to the cross coupling of the input and the output of power of each of the differential push-pull amplifiers or of the deterioration of the power added efficiency. Moreover, in the power amplifier shown in FIG. 4, the transformer and the plurality of MOS transistors 7A . . . 7D of the plurality of differential push-pull amplifiers need not be formed on the same Si chip. While the MOS transistors 7A . . . 7D are formed on a Si chip, the transformer having the annular shape can be formed on a printed wiring substrate which is lower in cost than the Si chip. Since the transformer having the annular shape, and formed on the printed wiring substrate and the MOS transistors 7A . . . 7D formed on the Si chip can be coupled to each other by the bonding wires, the manufacturing cost of the power amplifier can be reduced.

However, the examination conducted by the present inventors has revealed the problem that, in the power amplifier shown in FIG. 4, the input impedance of the primary coils of the transformer increases. That is, in the power amplifier shown in FIG. 4, the lengths of the first primary coil (the wire 1A, the cross wire 5F, and the wire 1B) and the second primary coil (the wire 1D, the cross wire 5G, the wire 1C, the cross wire 5E, and the wire 1E) are each generally equal to the perimeter of the annular shape of the transformer. Both ends of the first primary coil are coupled to the respective drains of the MOS transistors 7A and 7B of the first differential push-pull amplifier. Both ends of the second primary coil are coupled to the respective drains of the MOS transistors 7C and 7D of the second differential push-pull amplifier. The value of the input impedance of the primary coils is directly proportional to the length of each of the primary coils, i.e., to the perimeter of the annular shape. In the transformer shown in FIG. 4, the number of the differential push-pull amplifiers arranged around the annular shape is smaller than that in each of the transformers of the power amplifiers shown in FIGS. 1 and 2. Accordingly, the length of each of the primary coils between the respective drains of the two MOS transistors of one differential push-pull amplifier and the input impedance thereof increase.

When the input impedance of the primary coils of the transformer increases relative to the output impedance (of about several ohms) of the drain of each of the MOS transistors of the differential push-pull amplifier, matching conditions in output impedance matching performed by the transformer cannot be obtained. By reducing the radius and perimeter of the annular shape of the transformer, the input impedance of the primary coils of the transformer can be reduced. However, the examination conducted by the present inventors has revealed that, since the transformer consequently operates generally as a spiral inductor, the problem of a reduction in Q-factor occurs, as described in Non-Patent Document 4 listed above.

The present inventors have also discovered the problem that, in the transformer shown in FIG. 4, signal loss also occurs in the bonding wires 9A, 9B, 9C, and 9D for supplying the drain power supply voltage Vdd to the respective drains of the N-channel MOS transistors 7A, 7B, 7C, and 7D, and hence the power added efficiency (PAE) of the amplified RF output signal deteriorates.

Further, in the transformer shown in FIG. 4, the radius and perimeter of the annular shape of the first primary coil (the wire 1A, the cross wire 5F, and the wire 1B) are larger on the left-hand side of the quadrilateral than on the right-hand side thereof. By contrast, the radius and perimeter of the annular shape of the second primary coil (the wire 1D, the cross wire 5G, the wire 1C, the cross wire 5E, and the wire 1E) are larger on the right-hand side of the quadrilateral than on the left-hand side thereof. As a result, a subsidiary problem has been revealed that even-numbered harmonic distortion in the amplified RF output signal generated from the output terminal Output of each of the secondary coils 2A and 2B increases to cause the deterioration of an adjacent channel leakage power ratio (ACPR) and the power added efficiency (PAE). As shown above, ACPR is the abbreviation of the adjacent channel leakage power ratio.

The present invention has been achieved as a result of the foregoing examination conducted by the present inventors prior to the present invention.

It is therefore an object of the present invention to provide an RF power amplifier in which the primary-side input impedance of the transformer can be reduced without involving a reduction in Q-factor.

Another object of the present invention resides in reducing the deterioration of the power added efficiency (PAE) of the amplified RF output signal. An additional object of the present invention resides in reducing an increase in harmonic distortion in the RF power amplifier.

The above and other objects and novel features of the present invention will become apparent from the description of the present specification and the accompanying drawings.

As shown below, a brief description will be given of representative aspects of the invention disclosed in the present application.

That is, a representative RF power amplifier of the present invention includes first and second transistors (3A and 3B) each as an active device of a push-pull power amplification circuit, and a transformer (1A, 1B, and 2) as an output matching circuit.

Input signals (+Input and −Input) are supplied to the respective input terminals of the first and second transistors (3A and 3B).

The transformer has a primary coil (1A and 1B) and a secondary coil (2) which are magnetically coupled.

The primary coil (1A and 1B) of the transformer is coupled to each of the output terminals of the first and second transistors (3A and 3B), and an output signal (Output) is generated from the secondary coil (2) of the transformer.

The primary coil (1A and 1B) of the transformer includes at least a first coil (1A) and a second coil (1B) which are coupled in parallel between the respective output terminals of the first and second transistors (3A and 3B), and each is magnetically coupled to the secondary coil (2) (see FIG. 9).

The following is a brief description of effects obtained by the representative aspects of the invention disclosed in the present application.

That is, an RF power amplifier can be provided in which the primary-side input impedance of a transformer can be reduced without involving a reduction in Q-factor.

DESCRIPTION OF THE PREFERRED EMBODIMENTS

Representative Embodiment

Figure 1:
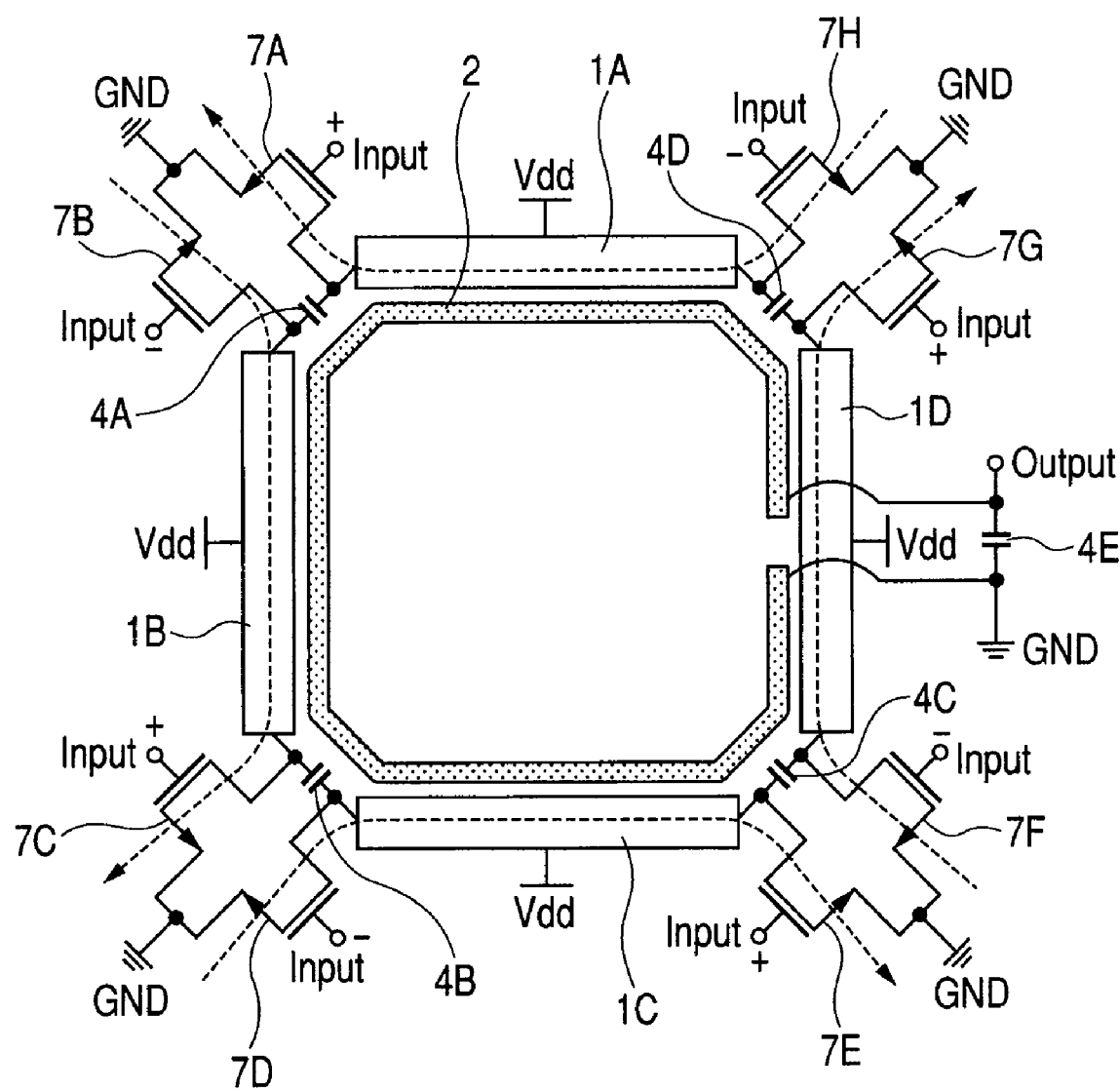
FIG. 1 shows a power amplifier examined by the present inventors based on the DAT power amplifier described in Non-Patent Document 3 prior to the present invention.
Figure 2:
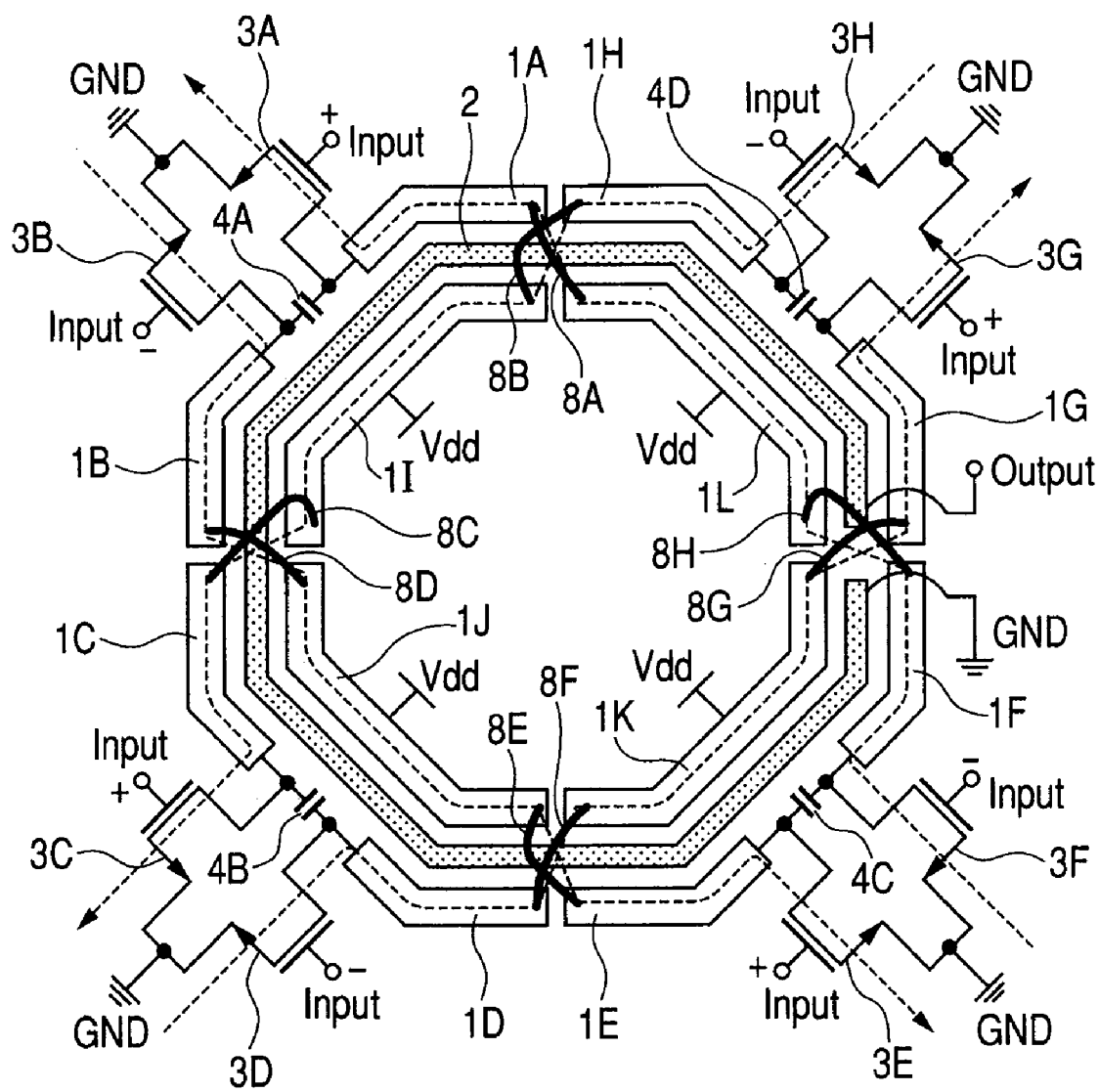
FIG. 2 also shows another power amplifier examined by the present inventors based on the DAT power amplifier described in Non-Patent Document 3 prior to the present invention.
Figure 3:
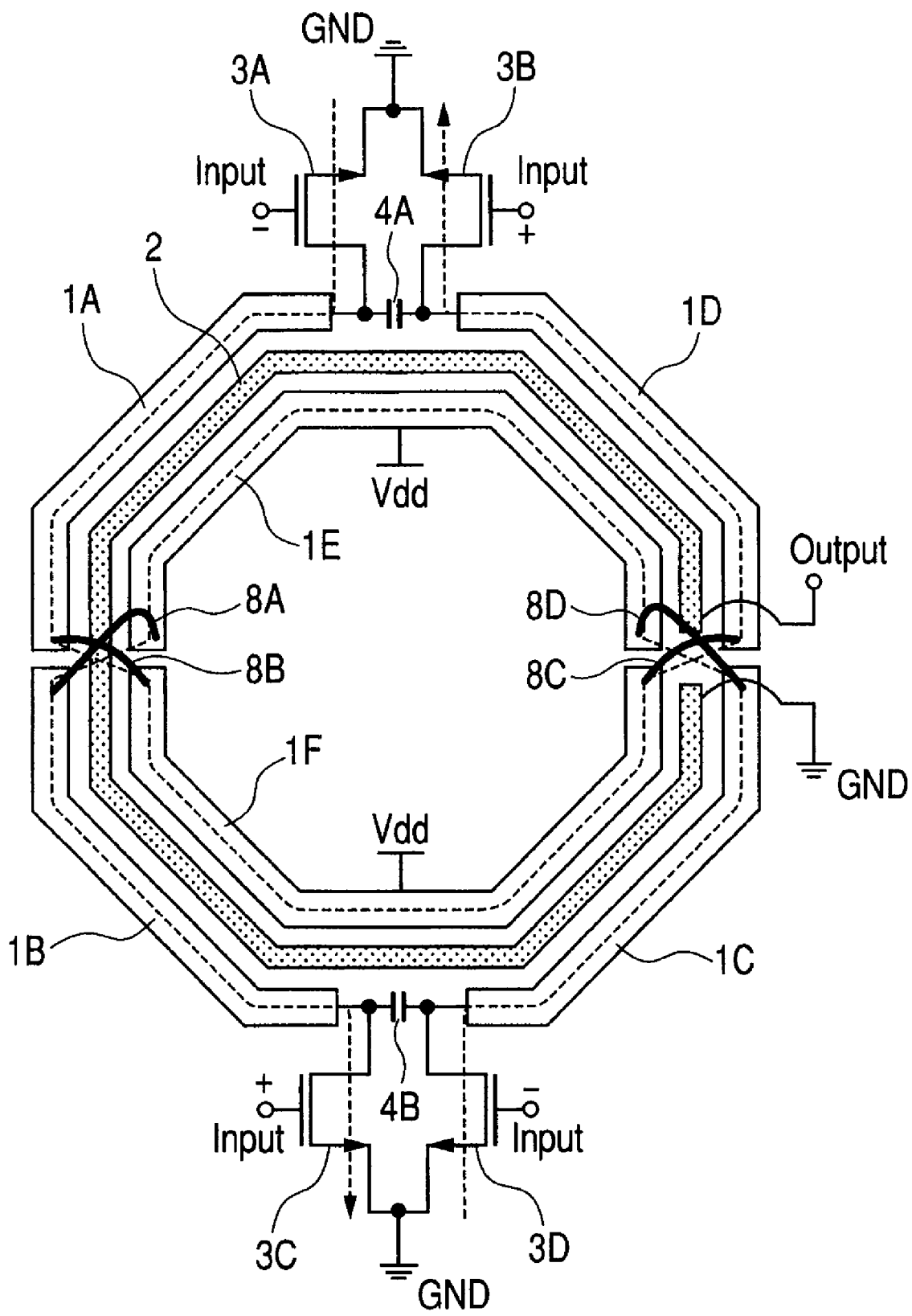
FIG. 3 also shows still another power amplifier examined by the present inventors based on the DAT power amplifier described in Non-Patent Document 3 prior to the present invention.

First, a description will be given of an outline of representative embodiments of the invention disclosed in the present application. Reference numerals in the drawings which are nestled in parentheses and referenced in the description of the outline of the representative embodiments are only illustrative of the content of the concept of the components provided with the reference numerals.

1. An RF power amplifier according to a representative embodiment of the present invention includes a first transistor (3A) and a second transistor (3B) each as an active device of a push-pull power amplification circuit, and a transformer (1A, 1B, and 2) as an output matching circuit of the push-pull power amplification circuit.

An input terminal of the first transistor (3A) and an input terminal of the second transistor (3B) can be respectively supplied with a non-inverted input signal (+Input) and an inverted input signal (−Input).

The transformer has a primary coil (1A and 1B) and a secondary coil (2) which are magnetically coupled.

One end and the other end of the primary coil (1A and 1B) of the transformer are coupled respectively to an output terminal of the first transistor (3A) and an output terminal of the second transistor (3B), and an output signal (Output) can be generated from between one end and the other end of the secondary coil (2) of the transformer.

Figure 5A:
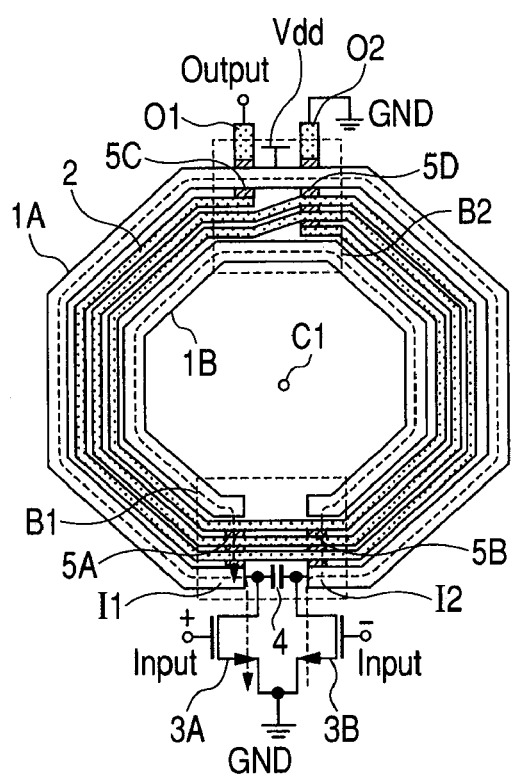
FIGS. 5(A) to 5(D) are views each showing a basic configuration of an RF power amplifier according to an embodiment of the present invention.

The primary coil (1A and 1B) of the transformer includes at least a first coil (1A) and a second coil (1B) which are coupled in parallel between the output terminal of the first transistor (3A) and the output terminal of the second transistor (3B), and each is magnetically coupled to the secondary coil (2) (see FIG. 5(A)).

According to the embodiment described above, the primary coil (1A and 1B) of the transformer includes at least the first coil (1A) and the second coil (1B) which are coupled in parallel. This allows a reduction in the primary-side input impedance of the transformer. In this case, since it is not necessary to reduce the radius and perimeter of the annular shape of the transformer, a reduction in Q-factor can be eliminated.

In a preferred embodiment, at least one of the first coil (1A) and the second coil (1B) can be supplied with a power supply voltage (Vdd) between the output terminal of the first transistor (3A) and the output terminal of the second transistor (3B) (see FIG. 5(A)).

According to the preferred embodiment described above, it is not necessary to use bonding wires as described in Non-Patent Document 4 listed above when the power supply voltage (Vdd) is supplied to the first transistor (3A) and the second transistor (3B). The power supply voltage is supplied using the primary coil having a low impedance. Therefore, it is possible to reduce the problem of the deterioration of the power added efficiency due to signal loss in the bonding wires described in Non-Patent Document 4 listed above.

In another preferred embodiment, the primary coil (1A and 1B) and the secondary coil (2) of the transformer are formed of respective metal thin-film wires having annular shapes, and each is formed flat over a surface of a substrate.

According to the another preferred embodiment described above, the heights of the members of the transformer can be reduced. This allows a reduction in the size of a mobile phone terminal when the RF power amplifier including the transformer is mounted in the mobile phone terminal.

In still another preferred embodiment, the metal thin-film wire forming the primary coil (1A and 1B) of the transformer is formed to have a width larger than a width of the metal thin-film wire forming the secondary coil (2) of the transformer.

In yet another preferred embodiment, the metal thin-film wire forming the primary coil (1A and 1B) of the transformer and the metal thin-film wire forming the secondary coil (2) of the transformer are formed around the annular shapes.

The primary coil (1A and 1B) and the secondary coil (2) are set to a predetermined ratio of turns to allow the transformer to execute an output matching operation in accordance with an impedance transformation ratio determined by the ratio of turns.

In a more preferred embodiment, the number of turns of the secondary coil (2) is set to generally an integral multiple of the number of turns of the primary coil (1A and 1B).

In a still more preferred embodiment, the first coil (1A) and the second coil (1B) of the primary coil (1A and 1B) of the transformer are formed respectively of an outer metal thin-film wire and an inner metal thin-film wire each having the annular shape.

The secondary coil (2) is formed of a middle metal thin-film wire formed between the outer metal thin-film wire and the inner metal thin-film wire (see FIGS. 5(A), 7, 8, 9, and 10).

In a specific embodiment, the secondary coil (2) formed of the middle metal thin-film wire between the outer metal thin-film wire and the inner metal thin-film wire is formed with a plural number of turns (see FIGS. 5(A), 7, 8, and 10).

Figure 6:
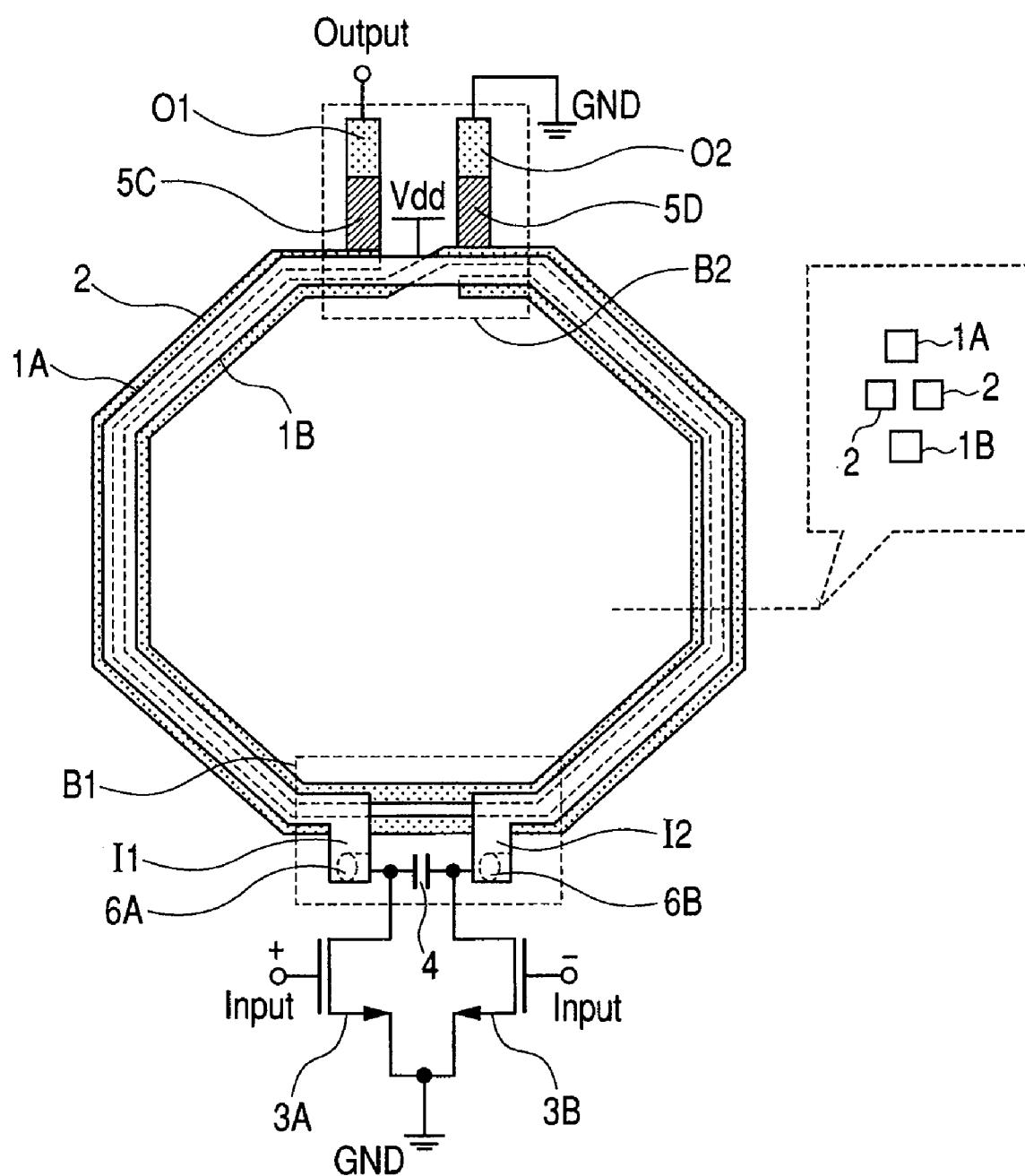
FIG. 6 is a view showing another configuration of the RF power amplifier according to the embodiment of the present invention.

In a more specific embodiment, the first coil (1A), the secondary coil (2), and the second coil (1B) are formed of a multilayer wiring structure formed over the surface of the substrate and, in the multilayer wiring structure, the secondary coil (2) is interposed between the first coil (1A) and the second coil (1B) (see FIG. 6).

Figure 11:
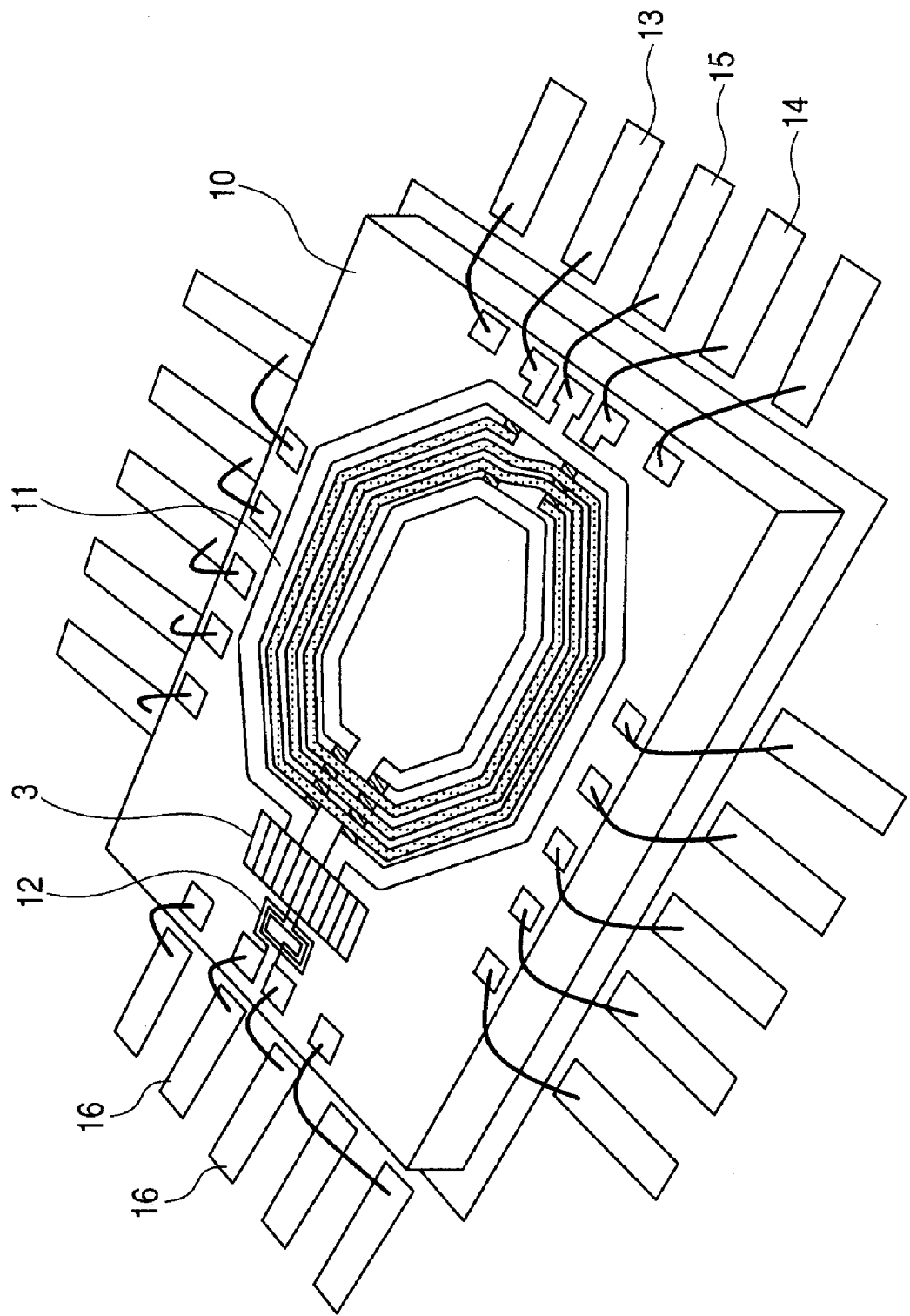
FIG. 11 is a view showing a configuration of a monolithic RF power amplifier according to another embodiment of the present invention, in which the transformer and N-channel MOS transistors of one push-pull power amplification circuit, each illustrated in FIG. 5, are integrated in a Si chip.
Figure 13:
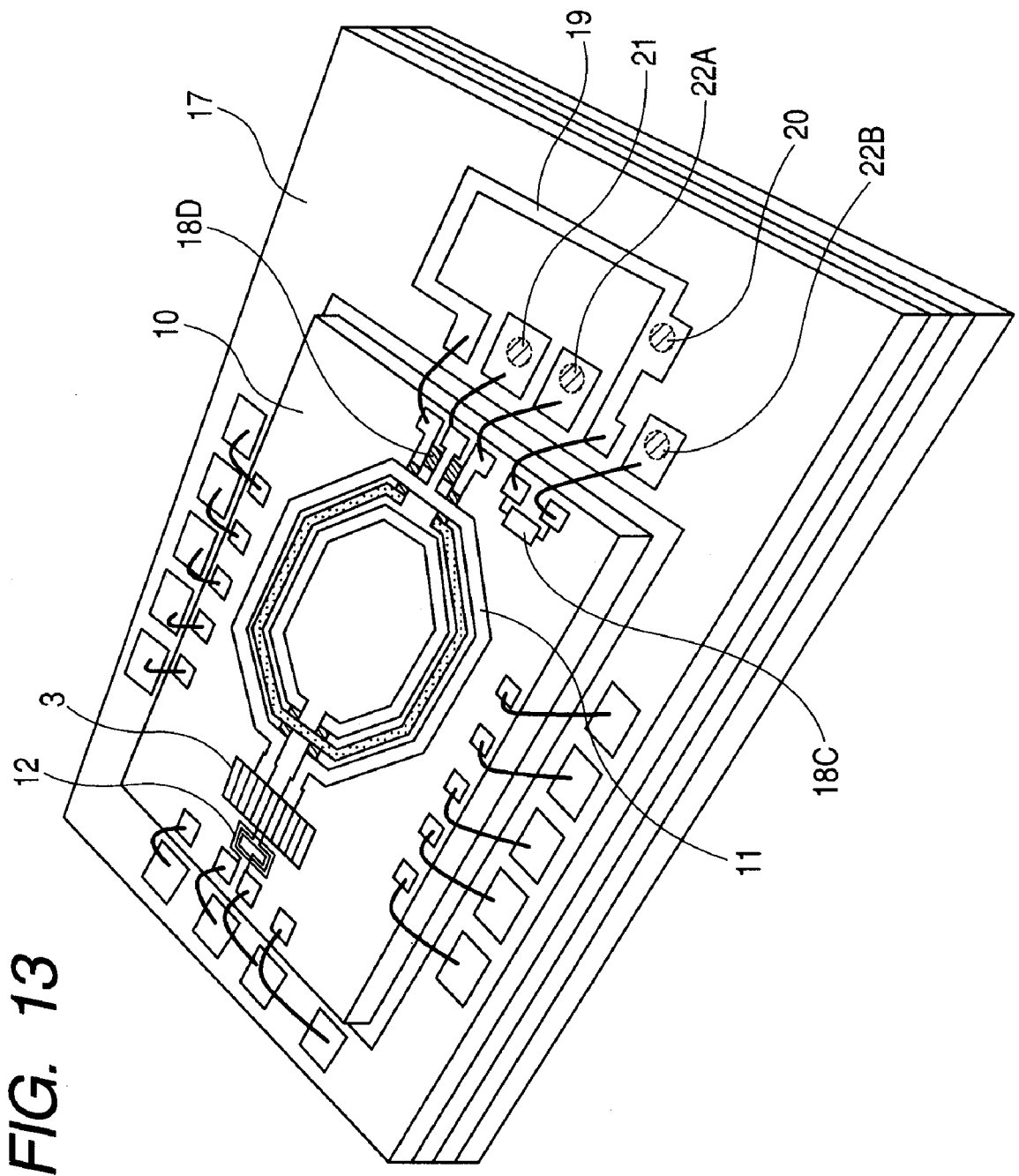
FIG. 13 is a plan view of a silicon chip showing a layout of various devices forming a semiconductor integrated circuit according to the embodiment of the present invention shown in FIG. 12.

In another specific embodiment, the substrate is a semiconductor chip (11), the first transistor (3A) and the second transistor (3B) are formed in the semiconductor chip (11), and the transformer is formed as an on-chip transformer on the semiconductor chip (11) (see FIGS. 11 and 13).

Figure 12:
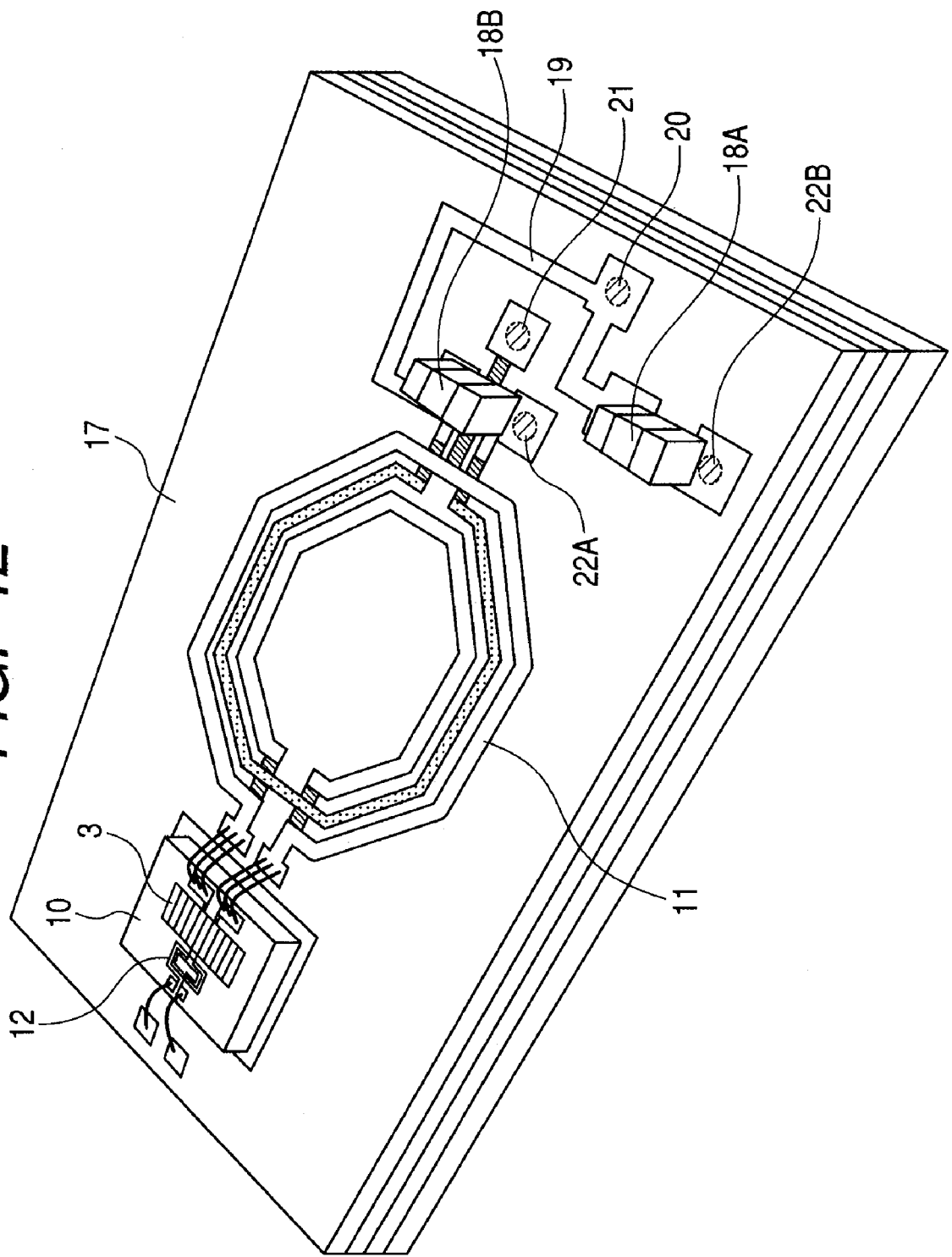
FIG. 12 is a view showing a configuration of an RF power amplifier module according to sill another embodiment of the present invention, in which the Si chip having the N-channel MOS transistors of the one push-pull power amplification circuit integrated therein and the output impedance matching transformer illustrated in FIG. 9 are embedded.
Figure 14:
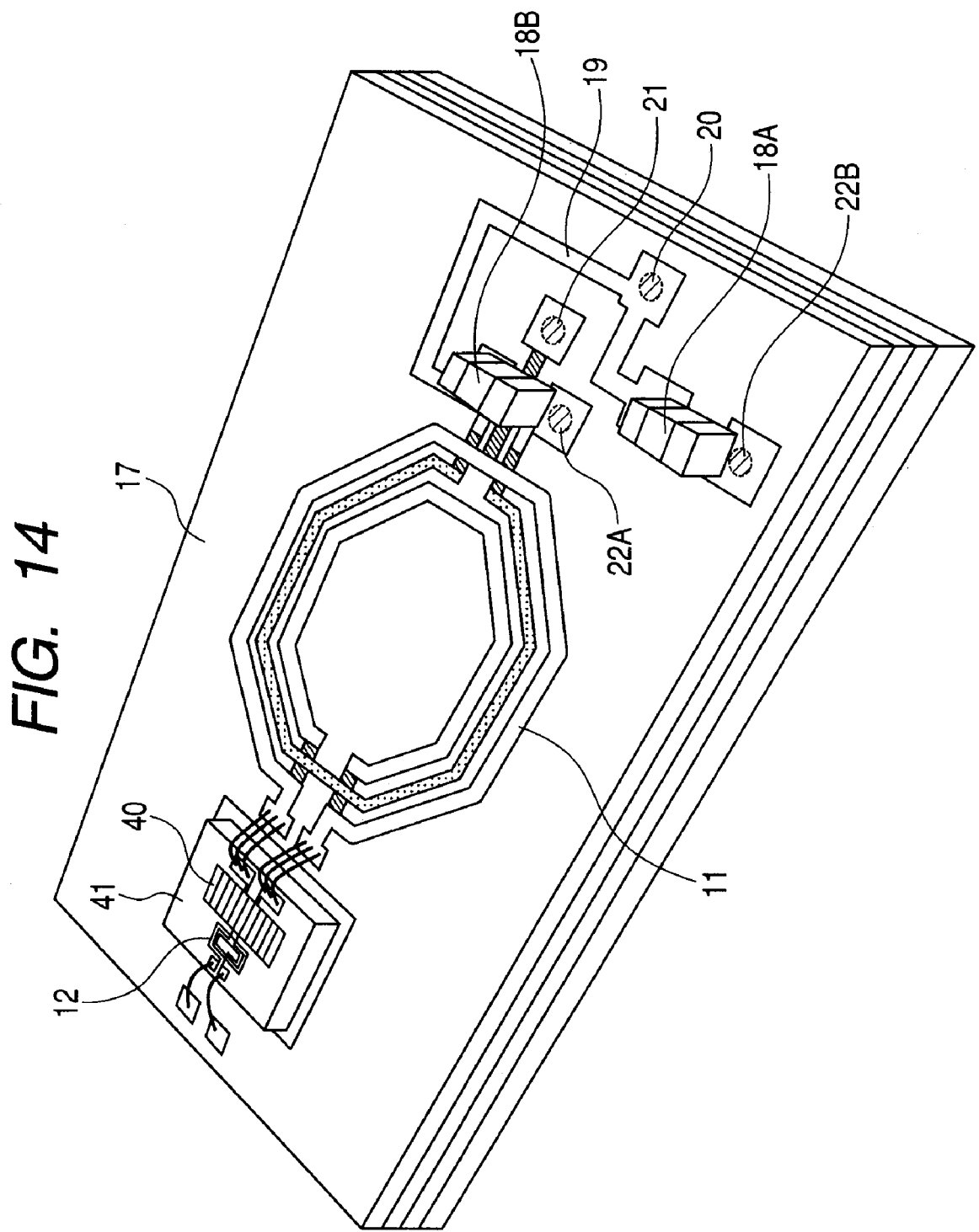
FIG. 14 is a view showing a configuration of an RF power amplifier module according to yet another embodiment of the present invention, in which a GaAs chip having a high-breakdown-voltage npn-type heterojunction bipolar transistor integrated therein as each of the transistors of the push-pull power amplification circuit and the output impedance matching transformer illustrated in FIG. 9 are embedded.

In a further different specific embodiment, the substrate having the transformer formed thereon is a wiring substrate (17), and the first transistor (3A) and the second transistor (3B) are formed in the semiconductor chip (11) (see FIGS. 12 and 14).

The transformer formed on the wiring substrate (17) is electrically coupled to each of the first transistor (3A) and the second transistor (3B) which are formed in the semiconductor chip (11) by a coupling wire.

In a still another specific embodiment, the primary coil (1A and 1B) of the transformer is formed in a symmetrical shape (see FIGS. 5(A) to 14).

According to the still another specific embodiment, even-numbered harmonic distortion in an amplified RF output signal generated from the output terminal (Output) of the secondary coil (2) can be reduced. As a result, it is possible to reduce the problem of the deterioration of the adjacent channel leakage power ratio (ACPR) and the power added efficiency (PAE).

In yet another specific embodiment, each of the first transistor (3A) and the second transistor (3B) is a MOS transistor (see FIGS. 5(A) to 13, and 15).

Specifically, the MOS transistor is an LDMOS transistor.

Figure 17:
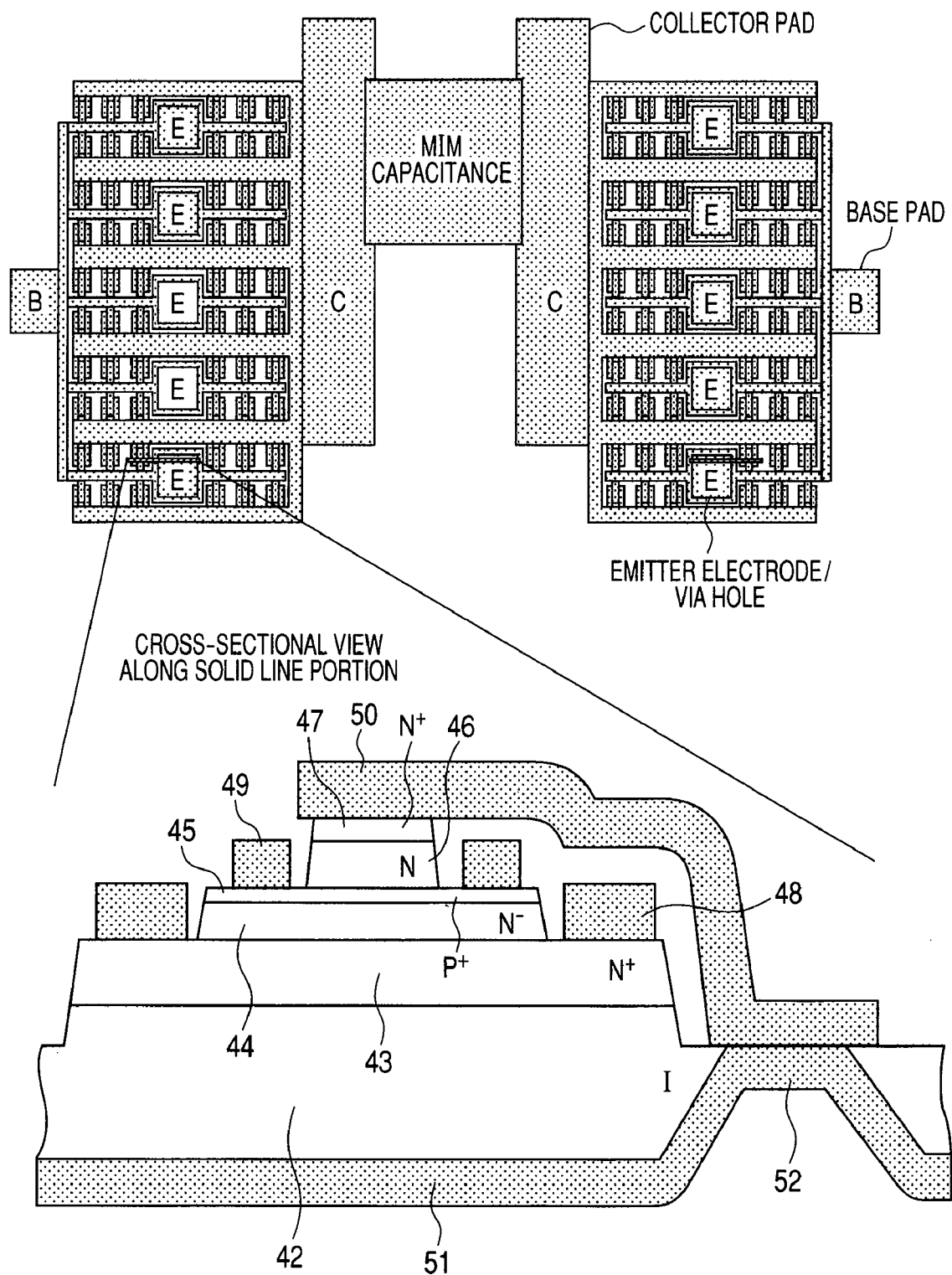
FIG. 17 is a view showing a configuration of the high-breakdown-voltage npn-type heterojunction bipolar transistor used in the push-pull power amplification circuit of the RF power amplifier according to the yet another embodiment of the present invention shown in FIG. 14.

In a still another specific embodiment, each of the first transistor (3A) and the second transistor (3B) is a bipolar transistor (see FIGS. 14 and 17).

Specifically, the bipolar transistor is a compound semiconductor heterojunction bipolar transistor.

In a most specific embodiment, the one end and the other end of the primary coil which are coupled to the first and second transistors and the one end and the other end of the secondary coil from between which the output signal can be generated are formed at mutually opposing locations in the annular shapes (see FIGS. 5(A) to 14).

2. An RF power amplifier according to a representative embodiment in another aspect of the present invention includes a first transistor (3A) and a second transistor (3B) each as an active device of a push-pull power amplification circuit, and a transformer (1A and 1B, and 2) as an output matching circuit of the push-pull power amplification circuit.

A non-inverted input signal (+Input) and an inverted input signal (−Input) can be supplied respectively to an input terminal of the first transistor (3A) and an input terminal of the second transistor (3B).

The transformer has a primary metal thin-film wire (1A and 1B) and a secondary metal thin-film wire (2), and the primary metal thin-film wire and the secondary metal thin-film wire are magnetically coupled to each other, and have respective annular shapes each formed flat over a surface of a substrate.

One end (I1) of the primary metal thin-film wire (1A and 1B) of the transformer is coupled to an output terminal of the first transistor (3A), while the other end (I2) of the primary metal thin-film wire of the transformer is coupled to an output terminal of the second transistor (3B).

An output signal (Output) can be generated from between one end (O1) and the other end (O2) of the secondary metal thin-film wire (2) of the transformer.

The one end (I1) and the other end (I2) of the primary metal thin-film wire (1A and 1B) of the transformer and the one end (O1) and the other end (O2) of the secondary metal thin-film wire (2) of the transformer are formed respectively in a first portion (B1) and a second portion (B2) of each of the annular shapes which oppose each other.

In the first portion (B1) of the annular shape, the one end (I1) and the other end (I2) of the primary metal thin-film wire (1A and 1B) of the transformer are disposed proximate to each other.

In the second portion (B2) of the annular shape, the one end (O1) and the other end (O2) of the secondary metal thin-film wire (2) of the transformer are disposed proximate to each other.

Figure 5B:
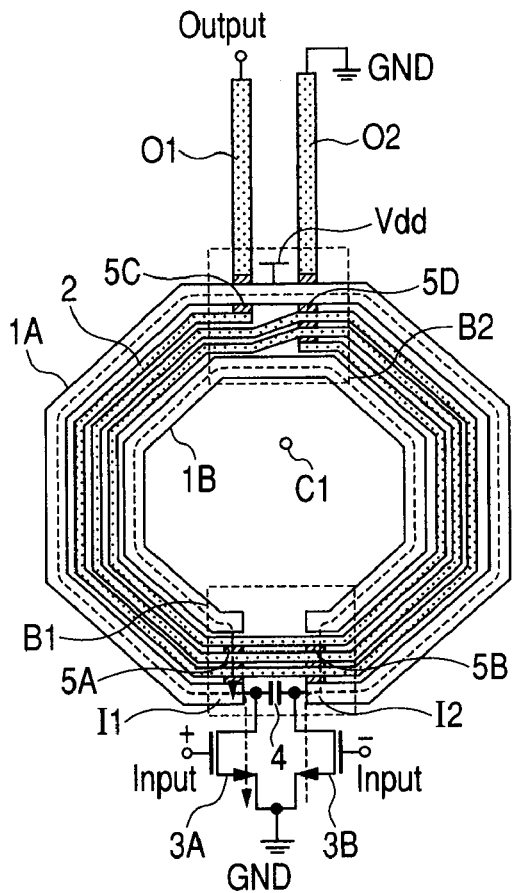

The primary metal thin-film wire (1A and 1B) of the transformer includes at least a first wire (1A) and a second wire (1B) which are coupled in parallel between the output terminal of the first transistor (3A) and the output terminal of the second transistor (3B), and each is magnetically coupled to the secondary metal thin-film wire (2) (see FIGS. 5(A) and 5(B)).

According to the embodiment described above, the primary metal thin-film wire (1A and 1B) of the transformer includes at least the first wire (1A) and the second wire (1B) which are coupled in parallel. This allows a reduction in the primary-side input impedance of the transformer.

Further, the one end (I1) and the other end (I2) of the primary metal thin-film wire (1A and 1B) of the transformer and the one end (O1) and the other end (O2) of the secondary metal thin-film wire (2) of the transformer are formed respectively in a first portion (B1) and a second portion (B2) of each of the annular shapes which oppose each other. In the first portion (B1) of the annular shape, the one end (I1) and the other end (I2) of the primary metal thin-film wire (1A and 1B) are disposed proximate to each other. In the second portion (B2) of the annular shape, the one end (O1) and the other end (O2) of the secondary metal thin-film wire (2) are disposed proximate to each other. As a result, the degree of coupling of the one end (O1) of the secondary metal thin-film wire (2) functioning as the complementary output terminal and one output of the transformer to the one end (I1) and the other end (I2) of the primary metal thin-film wire (1A and 1B) functioning as the complementary input terminals of the transformer can be generally equalized to the degree of coupling of the other end (O2) of the secondary metal thin-film wire (2) functioning as the complementary output terminal and the other output of the transformer to the one end (I1) and the other end (I2) of the primary metal thin-film wire (1A and 1B). As a result, it is possible to improve the stability of the operation of the push-pull power amplification circuit of the RF power amplifier.

Furthermore, according to the embodiment described above, the primary wire and secondary wire of the transformer are formed of respective metal thin-film wires (1A and 1B, and 2). This allows reductions in the heights of the members of the transformer, and allows a reduction in the size of a mobile phone terminal when the RF power amplifier including the transformer is mounted in the mobile phone terminal.

In a preferred embodiment, at least one of the first wire (1A) and the second wire (1B) can be supplied with a power supply voltage (Vdd) between the output terminal of the first transistor (3A) and the output terminal of the second transistor (3B) (see FIGS. 5(A) and 5(B)).

According to the preferred embodiment described above, it is not necessary to use bonding wires as described in Non-Patent Document 4 listed above when the power supply voltage (Vdd) is supplied to the first transistor (3A) and the second transistor (3B). The power supply voltage is supplied using the primary coil having a low impedance. Therefore, it is possible to reduce the problem of the deterioration of the power added efficiency due to signal loss in the bonding wires described in Non-Patent Document 4 listed above.

In a more preferred embodiment, the primary metal thin-film wire (1A and 1B) of the transformer is formed to have a width larger than a width of the secondary metal thin-film wire (2) of the transformer.

In another preferred embodiment, the primary metal thin-film wire (1A and 1B) of the transformer and the secondary metal thin-film wire (2) of the transformer are formed around the respective annular shapes.

The primary metal thin-film wire (1A and 1B) and the secondary metal thin-film wire (2) are set to a predetermined ratio of turns to allow the transformer to execute an output matching operation in accordance with an impedance transformation ratio determined by the ratio of turns.

In a still more preferred embodiment, the number of turns of the secondary metal thin-film wire (2) is set to generally an integral multiple of the number of turns of the primary metal thin-film wire (1A and 1B).

In a yet more preferred embodiment, the first wire (1A) and the second wire (1B) of the primary metal thin-film wire (1A and 1B) of the transformer are formed respectively of an outer metal thin-film wire and an inner metal thin-film wire each having the annular shape.

The secondary metal thin-film wire (2) is formed of a middle metal thin-film wire formed between the outer metal thin-film wire and the inner metal thin-film wire (see FIGS. 5(A), 5(B), 7, 8, 9, and 10).

In a specific embodiment, the secondary metal thin-film wire (2) formed of the middle metal thin-film wire between the outer metal thin-film wire and the inner metal thin-film wire is formed with a plural number of turns (see FIGS. 5(A), 5(B), 7, 8, and 10).

In a more specific embodiment, the first wire (1A), the secondary metal thin-film wire (2), and the second wire (1B) are formed of a multilayer wiring structure formed over the surface of the substrate and, in the multilayer wiring structure, the secondary metal thin-film wire (2) is interposed between the first wire (1A) and the second wire (1B) (See FIG. 6).

In another specific embodiment, the substrate is a semiconductor chip (11), the first transistor (3A) and the second transistor (3B) are formed in the semiconductor chip (11), and the transformer is formed as an on-chip transformer on the semiconductor chip (11) (see FIGS. 11 and 13).

In a further different specific embodiment, the substrate having the transformer formed thereon is a wiring substrate (17), and the first transistor (3A) and the second transistor (3B) are formed in the semiconductor chip (11).

The transformer formed on the wiring substrate (17) is electrically coupled to each of the first transistor (3A) and the second transistor (3B) which are formed in the semiconductor chip (11) by a coupling wire (see FIGS. 12 and 14).

In a still another specific embodiment, each of the first transistor (3A) and the second transistor (3B) is a MOS transistor (see FIGS. 5(A) and 5(B) to 13, and 15).

Specifically, the MOS transistor is an LDMOS transistor.

In a yet another specific embodiment, each of the first transistor (3A) and the second transistor (3B) is a bipolar transistor (see FIGS. 14 and 17).

Specifically, the bipolar transistor is a compound semiconductor heterojunction bipolar transistor.

In a most specific embodiment, in the first portion (B1) of the annular shape, only the first transistor (3A) and the second transistor (3B) are coupled to the one end (I1) and the other end (I2) of the primary metal thin-film wire (1A and 1B) of the transformer, each as the active device coupled to the primary metal thin-film wire.

The primary metal thin-film wire (1A and 1B) and the secondary metal thin-film wire (2) of the transformer are formed in respective symmetrical shapes with respect to an imaginary line coupling the first portion (B1) and the second portion (B2) to each other (see FIGS. 5(A) and 5(B) to 14).

According to the most specific embodiment described above, the radius and perimeter of the annular shape of the transformer have symmetrical shapes. This allows the elimination of a reduction in Q-factor. In addition, since even-numbered harmonic distortion in the amplified RF output signal generated from the output terminal (Output) of the secondary metal thin-film wire (2) can be reduced, it is possible to reduce the problem of the deterioration of the adjacent channel leakage power ratio (ACPR) and the power added efficiency (PAE).

Description of Embodiments

Next, the embodiments will be described in greater detail. Throughout the drawings for illustrating the best mode for carrying out the invention, members having the same functions as in the drawings described above will be denoted by the same reference numerals, and a repeated description thereof is omitted.

Basic Configuration of RF Power Amplifier

FIGS. 5(A) to 5(D) are views each showing a basic configuration of an RF power amplifier according to an embodiment of the present invention.

Figure 5C:
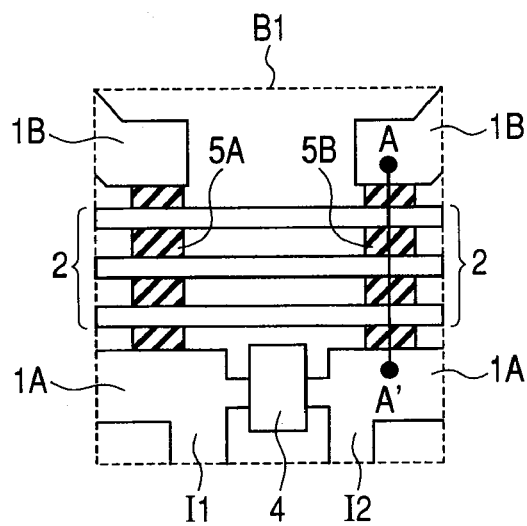
Figure 5D:
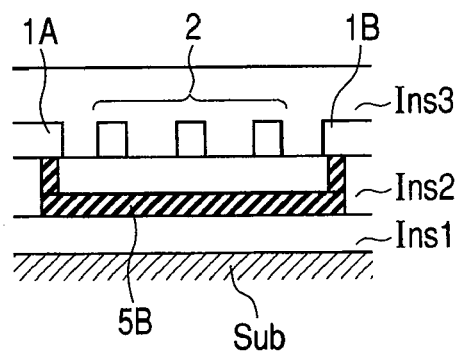

FIG. 5(A) shows a representative configuration in which a transformer is disposed at a generally midpoint C1 between the input terminals I1 and I2 thereof and the output terminals O1 and O2 thereof. FIG. 5(B) shows a configuration in which the transformer is disposed at a position shifted from the generally midpoint C1 between the input terminals I1 and I2 thereof and the output terminals O1 and O2 thereof. FIG. 5(C) shows an enlarged view of the portion surrounded by the broken line B1 of FIG. 5(A). FIG. 5(D) is a cross-sectional view of a portion along the line A-A' in FIG. 5(C). Note that the input terminals I1 and I2 and the output terminals O1 and O2 of the transformer are respectively formed in the above-mentioned first and second portions B1 and B2 of each of the annular shapes which oppose each other.

That is, in the RF power amplifier shown in FIGS. 5(A) to 5(D), two source-grounded high-breakdown-voltage N-channel MOS transistors 3A and 3B are used as active devices. The respective input terminals, output terminals, and ground terminals of the transistors serve as the respective gates, drains, and sources thereof. As an output matching circuit and a power combining circuit, an on-chip transformer is used which includes a plurality of (two) metal wires 1A and 1B as a primary coil having an annular shape, and a metal thin-film wire 2 as a 3-turn metal strip of a secondary coil between the two metal wires 1A and 1B of the primary coil. Between the respective drains of the N-channel MOS transistors 3A and 3B of one push-pull power amplification circuit, the two outer and inner metal wires 1A and 1B as the primary coil of the on-chip transformer are coupled in parallel. Since the parallel coupling thereof reduces the inductance of the primary coil, it is possible to reduce the input impedance of the primary coil of the on-chip transformer. In addition, since the widths of the two thin-film metal wires 1A and 1B of the primary coil are set larger than the width of the metal thin-film wire 2 of the secondary coil, it is possible to reduce the input impedance of the primary coil of the on-chip transformer. At this time, since the radius and perimeter of the annular shape of the transformer can be held without being reduced, it is possible to eliminate a reduction in Q-factor.

At the middle of the uppermost side of the annular shape, the power supply voltage Vdd is supplied to the midpoint of the outer metal wire 1A as the primary coil. At the middle of the uppermost side of the annular shape, the power supply voltage Vdd can be supplied to the midpoint of the inner metal wire 1B as the primary coil via a cross wire or the like not shown, though not depicted in FIGS. 5(A) to 5(D). Therefore, it is possible to reduce the problem of the deterioration of the power added efficiency due to signal loss in the bonding wires for supplying the power supply voltage to the respective drains of the N-channel MOS transistors, which has been described with reference to FIG. 4.

As shown in FIGS. 5(A) and 5(C), the drain of the N-channel MOS transistor 3A as one of the N-channel MOS transistors is coupled to one end (first input terminal I1) of the outer metal wire 1A and to one end of a lower-layer cross wire 5A at locations leftward of the middle of the lowermost side of the annular shape, while the other end of the lower-layer cross wire 5A is coupled to one end of the inner metal wire 1B. The drain of the N-channel MOS transistor 3B as the other of the N-channel MOS transistors is coupled to the other end (second input terminal I2) of the outer metal wire 1A and to one end of a lower-layer cross wire 5B at locations rightward of the middle of the lowermost side of the annular shape, while the other end of the lower-layer cross wire 5B is coupled to the other end of the inner metal wire 1B. Note that, as shown in FIG. 5(D), the metal wires 1A and 1B as the primary coil of the transformer, the secondary coil 2 of the transformer, and the lower-layer cross wires 5A and 5B are formed of a multilayer wiring structure. Over the surface of a substrate Sub, a first-layer insulating film Ins1 is formed. Over the surface of the first-layer insulating film Ins1, the lower-layer cross wire 5B and a second-layer insulating film Ins2 are formed. Over the surface of the second-layer insulating film Ins2, the metal wires 1A and 1B as the primary coil of the transformer and the secondary coil 2 of the transformer are formed. Over the metal wires 1A and 1B and the secondary coil 2, a third-layer insulating film Ins3 is formed. The two outer and inner metal wires 1A and 1B as the primary coil are coupled in parallel, and the primary coil is formed with one turn around the annular shape.

To the gate of the N-channel MOS transistor 3A as one of the N-channel MOS transistors, the non-inverted input signal +Input is supplied, while the inverted input signal −Input is supplied to the gate of the N-channel MOS transistor 3B as the other of the N-channel MOS transistors. The length of each of the metal wires 1A and 1B of the primary coil is generally equal to the perimeter of the annular shape, and the parallel coupling of the two metal wires 1A and 1B of the primary coil allows the input impedance of the primary coil between the respective drains of the two N-channel MOS transistors 3A and 3B to be reduced to one-half. Note that, between the respective drains of the two N-channel MOS transistors 3A and 3B, a capacitor 4 for reducing the level of an odd-numbered harmonic is coupled. The capacitor 4 is formed of, e.g., a MIM capacitor that can be manufactured by a CMOS manufacturing process. The MIM capacitor is formed by forming capacitive electrodes over and under a capacitive insulating film. Note that MIM is the abbreviation of Metal-Insulator-Metal.

Between the two metal wires 1A and 1B coupled in parallel of the primary coil, the metal thin-film wire 2 as the metal strip of the secondary coil is disposed with three turns. One end (second output terminal O2) of the metal thin-film wire 2 which is located rightward of the middle of the uppermost side of the annular shape is coupled to a ground voltage GND via a lower-layer cross wire 5D. The metal thin-film wire 2 is formed to extend from a start point corresponding to the one end thereof located rightward of the middle of the uppermost side of the annular shape, make three clockwise turns, and reach an end point corresponding to the other end (first output terminal O1) thereof located leftward of the middle of the uppermost side of the annular shape. The end point corresponding to the other end located leftward of the middle of the uppermost side of the annular shape is coupled to a lower-layer cross wire 5C, and the output signal Output is generated via the lower-layer cross wire 5C. Accordingly, the ratio of turns (Turn Ratio) between the primary coil and the secondary coil is 1:3 so that the impedance transformation ratio in the basic theory of the on-chip transformer as the output impedance matching circuit of the RF power amplifier is $1:3^2$. The present inventors have calculated the impedance transformation ratio of the RF power amplifier shown in FIGS. 5(A) to 5(D) by electromagnetic field simulation, and found that an impedance transformation ratio of 1:11, which is more excellent than the value in the basic theory, is obtainable. The reason that the impedance transformation ratio more excellent than the value in the basic theory is obtainable with the RF power amplifier shown in FIGS. 5(A) to 5(D) results from the reduction of the input impedance of the primary coil formed of the two parallel-coupled metal wires 1A and 1B to one-half of an input impedance obtained in a normal case.

In the RF power amplifier shown in FIGS. 5(A) to 5(D), it is suggested to use a high-breakdown-voltage transistor having a relatively high output impedance as each of the N-channel MOS transistors 3A and 3B of the push-pull power amplification circuit. As the high-breakdown-voltage transistor, there can be used a laterally diffused (LD) N-channel MOS transistor or a high-breakdown-voltage npn-type heterojunction bipolar transistor using a compound semiconductor such as GaAs.

In contrast to the DAT power amplifier shown in FIG. 1, in the RF power amplifier shown in FIGS. 5(A) to 5(D), the two metal wires 1A and 1B of the primary coil are coupled in parallel. Since the number of the push-pull power amplification circuits arranged around the annular shape is reduced to one-fourth, the input impedance of the primary coil is generally doubled. Therefore, by using a high-breakdown-voltage transistor having a relatively high output impedance as each of the N-channel MOS transistors 3A and 3B of the RF power amplifier shown in FIGS. 5(A) to 5(D), it is possible to obtain impedance matching conditions between the output impedance of the MOS transistors and the input impedance of the primary coil of the transformer.

In the LD N-channel MOS transistor, an N-type low-impurity-concentration region is formed between the gate and the drain, thereby significantly improving the breakdown voltage thereof compared with that of a typical short-channel MOS transistor formed by a normal CMOS manufacturing process. Because the low-impurity-concentration region of the LD N-channel MOS transistor reduces the drain output capacitance thereof, a high-efficiency and low-distortion-factor RF power amplification characteristic is obtainable. Because of the high breakdown voltage, resistance to dielectric breakdown can also be improved.

By using an LD N-channel MOS transistor as each of the N-channel MOS transistors 3A and 3B of the RF power amplifier shown in FIGS. 5(A) to 5(D), it is possible to obtain excellent impedance matching conditions between the relatively high output impedance of the LDMOS transistors and the input impedance of the primary coil of the transformer.

Figure 4:
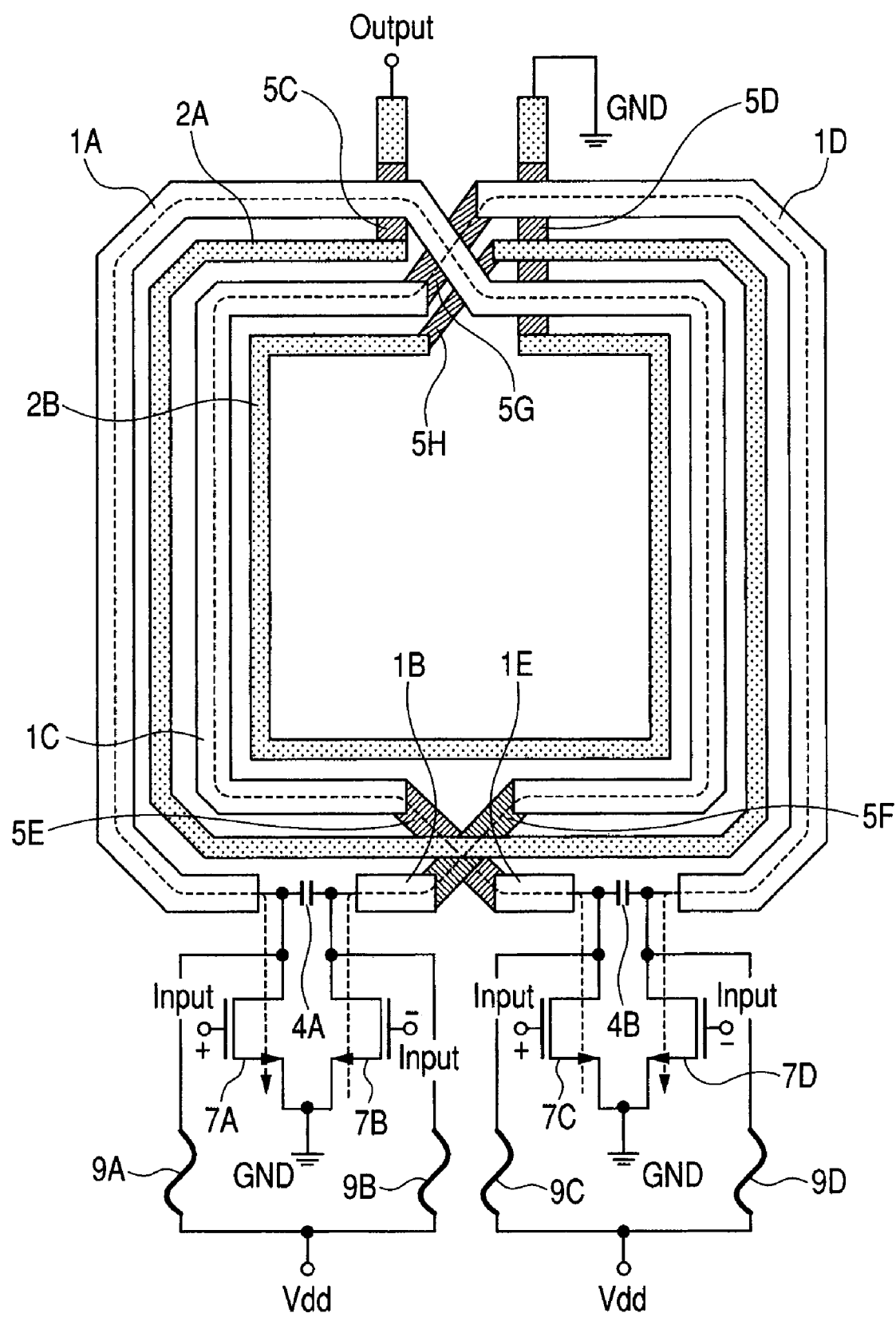
FIG. 4 shows a power amplifier examined by the present inventors based on the DAT power amplifier described in Non-Patent Document 4 prior to the present invention.

In the power amplifier shown in FIG. 4 also, the number of the push-pull power amplification circuits arranged around the annular shape is reduced to one-fourth of that in the DAT power amplifier shown in FIG. 1. Accordingly, the input impedance of the primary coil is generally quadrupled. Even when an LDMOS transistor having a relatively high output impedance is used as each of the N-channel MOS transistors 7A, 7B, 7C, and 7D of the RF power amplifier of FIG. 4, it has been impossible to obtain excellent impedance matching conditions between the MOS transistors and the input impedance of the primary coil of the transformer. As a result, it has been recognized by the present inventors that the maximum RF output power Pout(max) when the LDMOS transistor is employed in the power amplifier shown in FIG. 4 is generally 33 dBm at most.

By contrast, when the LDMOS transistor is employed in the RF power amplifier shown in FIGS. 5(A) to 5(D), excellent impedance matching conditions can be obtained. As a result, it has been recognized by the present inventors that the maximum RF output power Pout(max) can be increased to generally 35 dBm.

In the RF power amplifier shown in FIGS. 5(A) to 5(D), the radius and perimeter of each of the annular shapes of the two metal wires 1A and 1B of the primary coil of the on-chip transformer are bilaterally symmetrical relative to the annular shape. Therefore, even-numbered harmonic distortion in the amplified RF output signal generated from the output terminal Output of the secondary coil 2 can be reduced, and therefore the problem of the deterioration of the adjacent channel leakage power ratio (ACPR) and the power added efficiency (PAE) can be reduced.

Another Configuration of RF Power Amplifier

FIG. 6 is a view showing another configuration of the RF power amplifier according to the embodiment of the present invention.

That is, the RF power amplifier shown in FIG. 6 is different from the RF power amplifier shown in FIG. 5 (5(A) to 5(D)) in the following point.

In the RF power amplifier shown in FIG. 6, the two metal wires 1A and 1B coupled in parallel of the primary coil are formed over and under the metal thin-film wire 2 disposed with two turns as the metal strip of the secondary coil, as shown in the right-hand cross-sectional structure of FIG. 6. As a result, the metal wire 1B, the metal thin-film wire 2, and the metal wire 1A are formed respectively of the first-layer metal wire, the second-layer metal wire, and the third-layer metal wire each overlying a Si chip.

As shown in the plan view of FIG. 6, one end of the metal thin-film wire 2 as the second-layer metal wire which is located rightward of the middle of the uppermost side of the annular shape thereof is coupled to the ground voltage GND via the lower-layer cross wire 5D. The metal thin-film wire 2 is formed to extend from a start point corresponding to the inner one end thereof located rightward of the middle of the uppermost side of the annular shape, make two clockwise turns, and reach an end point corresponding to the outer other end thereof located leftward of the middle of the uppermost side of the annular shape. Between the outer other end of the metal thin-film wire 2 which is located leftward of the middle of the uppermost side of the annular shape thereof and the inner one end of the metal thin-film wire 2 which is located rightward of the middle of the uppermost side of the annular shape thereof, the inner annular shape portion of the metal thin-film wire 2 and the outer annular shape portion thereof are coupled. Also, between the outer other end of the metal thin-film wire 2 and the inner one end thereof, the power supply voltage Vdd is supplied to the midpoint of the metal wire 1B as the first-layer metal wire and to the midpoint of the metal wire 1A as the third-layer metal wire.

In the RF power amplifier shown in FIG. 6 also, the two outer and inner metal wires 1A and 1B as the primary coil of the on-chip transformer are coupled in parallel between the respective drains of the N-channel MOS transistors 3A and 3B of the one push-pull power amplification circuit. The parallel coupling thereof reduces the inductance of the primary coil, and can reduce the input impedance of the primary coil. At this time, the radius and perimeter of the annular shape of the transformer can be held without being reduced and hence a reduction in Q-factor can be eliminated.

Further, at the middle of the uppermost side of the annular shape, the power supply voltage Vdd is supplied to the midpoint of the metal wire 1B as the first-layer metal wire and to the midpoint of the metal wire 1A as the third-layer metal wire. Therefore, it is possible to reduce the problem of the deterioration of the power added efficiency due to signal loss in the bonding wires for supplying the power supply voltage to the respective drains of the N-channel MOS transistors, which has been described with reference to FIG. 4.

In the RF power amplifier shown in FIG. 6, the ratio of turns (Turn Ratio) between the primary coil and the secondary coil is 1:2 so that the impedance transformation ratio in the basic theory of the on-chip transformer as the output impedance matching circuit of the RF power amplifier is $1:2^2$. The present inventors have calculated the impedance transformation ratio of the RF power amplifier shown in FIG. 6 by electromagnetic field simulation, and found that an impedance transformation ratio of 1:5.7, which is more excellent than the value in the basic theory, is obtainable. The reason that the impedance transformation ratio more excellent than the value in the basic theory is obtainable with the RF power amplifier shown in FIG. 6 results from the reduction of the input impedance of the primary coil formed of the two parallel-coupled metal wires 1A and 1B to one-half of an input impedance obtained in a normal case.

By using an LD N-channel MOs transistor as each of the N-channel MOS transistors 3A and 3B of the RF power amplifier shown in FIG. 6, excellent impedance matching conditions can be obtained between the relatively high output impedance of the LDMOS transistors and the input impedance of the primary coil of the transformer.

In the RF power amplifier shown in FIG. 6 also, the radius and perimeter of each of the annular shapes of the two metal wires 1A and 1B of the primary coil of the on-chip transformer are bilaterally symmetrical relative to the annular shape. Therefore, it is possible to reduce even-numbered harmonic distortion in the amplified RF output signal generated from the output terminal Output of the secondary coil 2, and reduce the deterioration of the adjacent channel leakage power ratio (ACPR) and the power added efficiency (PAE). Note that, in FIG. 6, the two metal wires 1A and 1B of the primary coil which are formed over and under the metal thin-film wire 2 of the secondary coil are electrically coupled to each other by vias 6A and 6B. Through holes are formed in the interlayer insulating film between the metal wires 1A and 1B formed over and under the metal thin-film wire 2, and the vias 6A and 6B are formed by filling the through holes with a wiring metal.

Figure 7:
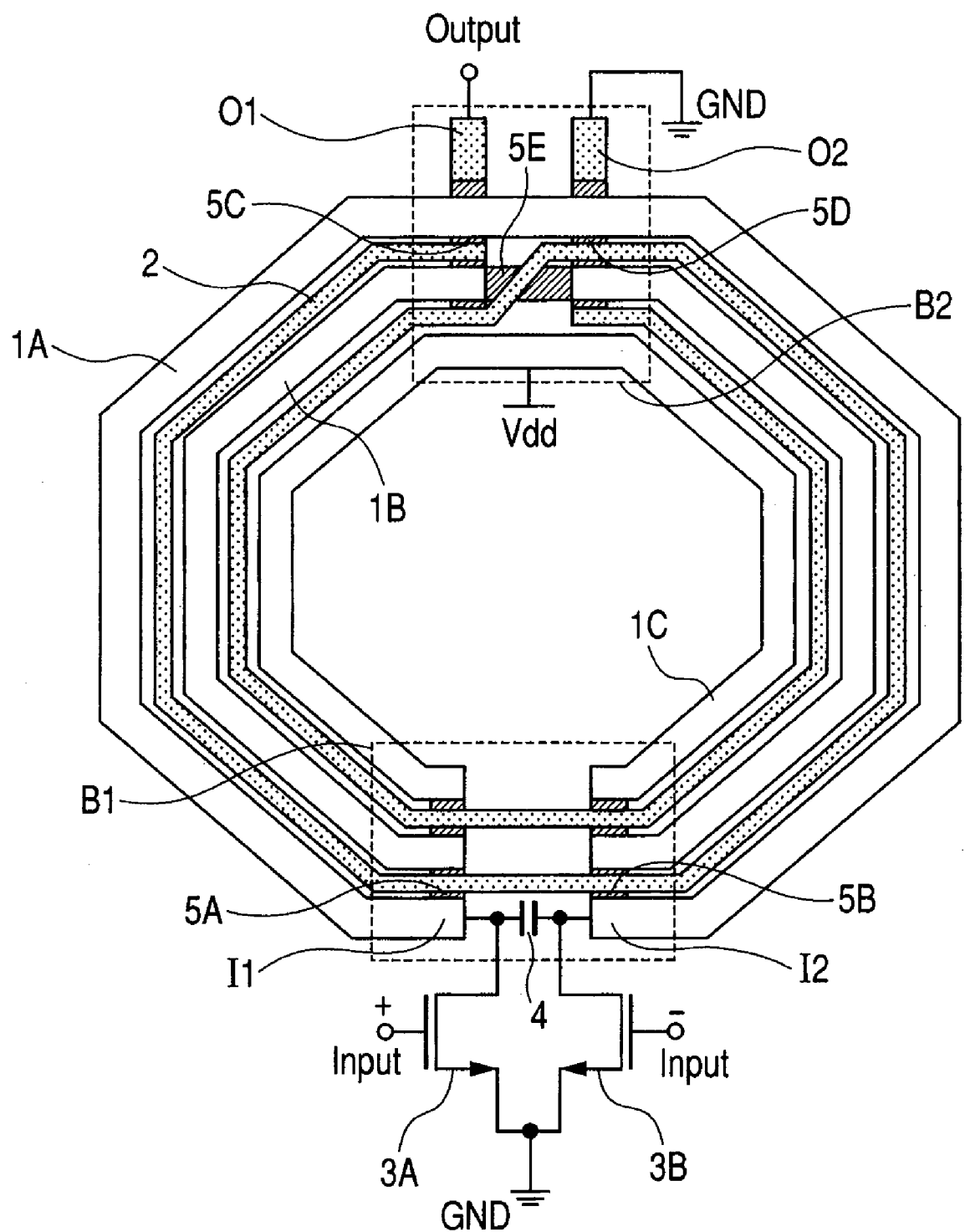
FIG. 7 is a view showing still another configuration of the RF power amplifier according to the embodiment of the present invention.

FIG. 7 is a view showing still another configuration of the RF power amplifier according to the embodiment of the present invention.

That is, the RF power amplifier shown in FIG. 7 is different from the RF power amplifier shown in FIG. 5 in the following point.

In the RF power amplifier shown in FIG. 7, the metal thin-film wire 2 disposed with two turns as the metal strip of the second coil is formed between three metal wires 1A, 1B, and 1C coupled in parallel of the primary coil.

As shown in the plan view of FIG. 7, one end of the metal thin-film wire 2 which is located rightward of the middle of the uppermost side of the annular shape thereof is coupled to the ground voltage GND via the lower-layer cross wire 5D. The metal thin-film wire 2 is formed to extend from a start point corresponding to the inner one end thereof located rightward of the middle of the uppermost side of the annular shape, make two clockwise turns, and reach an end point corresponding to the outer other end thereof located leftward of the middle of the uppermost side of the annular shape. Between the outer other end of the metal thin-film wire 2 which is located leftward of the middle of the uppermost side of the annular shape thereof and the inner one end of the metal thin-film wire 2 which is located rightward of the middle of the uppermost side of the annular shape thereof, the inner annular shape portion of the metal thin-film wire 2 and the outer annular shape portion thereof are coupled. Also, between the outer other end of the metal thin-film wire 2 and the inner one end thereof, the power supply voltage Vdd is supplied to the midpoint of the metal wire 1C, to the midpoint of the metal wire 1B, and to the midpoint of the metal wire 1A.

In the RF power amplifier shown in FIG. 7 also, the three outer, middle, and inner metal wires 1A, 1B, and 1C are coupled in parallel as the primary coil of the on-chip transformer between the respective drains of the N-channel MOS transistors 3A and 3B of the one push-pull power amplification circuit. The parallel coupling thereof reduces the inductance of the primary coil, and can reduce the input impedance of the primary coil. In addition, since the width of each of the three metal wires 1A, 1B, and 1C of the primary coil is set larger than the width of the metal thin-film wire 2 of the secondary coil, it is possible to reduce the input impedance of the primary coil of the on-chip transformer. It has been recognized by the present inventors that, compared with the maximum RF output power Pout(max) in each of the RF power amplifiers shown in FIGS. 5 and 6, the maximum RF output power Pout(max) in the RF power amplifier shown in FIG. 7 increases generally by 0.5 dBm. Moreover, since the radius and perimeter of the annular shape of the transformer can be held without being reduced, a reduction in Q factor can be eliminated.

Furthermore, since the power supply voltage Vdd is supplied to the midpoint of the inner metal wire 1C, to the midpoint of the middle metal wire 1B, and to the midpoint of the outer metal wire 1A, it is possible to reduce the problem of the deterioration of the power added efficiency due to signal loss in the bonding wires for supplying the power supply voltage to the respective drains of the N-channel MOS transistors, which has been described with reference to FIG. 4.

In the RF power amplifier shown in FIG. 7 also, the ratio of turns (Turn Ratio) between the primary coil and the secondary coil is 1:2 so that the impedance transformation ratio in the basic theory of the on-chip transformer as the output impedance matching circuit of the RF power amplifier is $1:2^2$. The present inventors have calculated the impedance transformation ratio of the RF power amplifier shown in FIG. 7 by electromagnetic field simulation, and found that an impedance transformation ratio of 1:6, which is more excellent than the value in the basic theory, is obtainable. The reason that the impedance transformation ratio more excellent than the value in the basic theory is obtainable with the RF power amplifier shown in FIG. 7 results from the reduction of the input impedance of the primary coil formed of the three parallel-coupled metal wires 1A, 1B, and 1C to one-third of an input impedance obtained in a normal case.

By using an LD N-channel MOS transistor as each of the N-channel MOS transistors 3A and 3B of the RF power amplifier shown in FIG. 7, excellent impedance matching conditions can be obtained between the relatively high output impedance of the LDMOS transistors and the input impedance of the primary coil of the transformer.

In the RF power amplifier shown in FIG. 7 also, the radius and perimeter of each of the annular shapes of the three metal wires 1A, 1B, and 1C of the primary coil of the on-chip transformer are bilaterally symmetrical. Therefore, it is possible to reduce even-numbered harmonic distortion in the amplified RF output signal generated from the output terminal Output of the secondary coil 2, and reduce the deterioration of the adjacent channel leakage power ratio (ACPR) and the power added efficiency (PAE).

Figure 8:
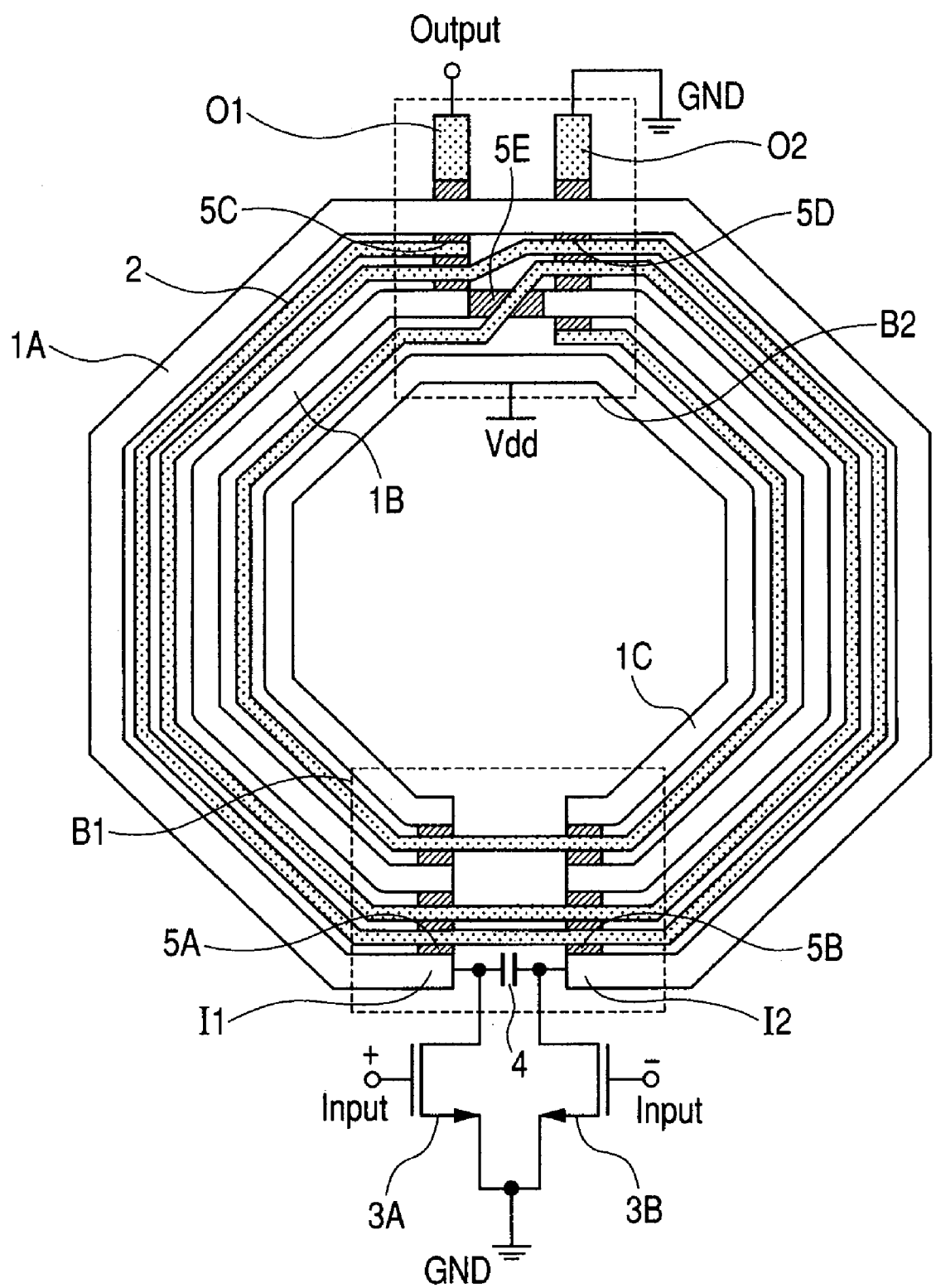
FIG. 8 is a view showing yet another configuration of the RF power amplifier according to the embodiment of the present invention.

FIG. 8 is a view showing yet another configuration of the RF power amplifier according to the embodiment of the present invention.

That is, the RF power amplifier shown in FIG. 8 is different from the RF power amplifier shown in FIG. 7 in the following point.

In the RF power amplifier shown in FIG. 8, the metal thin-film wire 2 as the metal strip of the secondary coil has one more additional turn between the outer metal wire 1A and the middle metal wire 1B of the primary coil of the transformer. Accordingly, the number of turns of the metal thin-film wire 2 is three so that the ratio of turns (Turn Ratio) between the primary coil and the secondary coil is 1:3, and the impedance transformation ratio in the basic theory of the on-chip transformer as the output impedance matching circuit of the RF power amplifier is $1:3^2$. In the RF power amplifier shown in FIG. 8 also, generally the same useful operation and effect as achieved with each of the RF power amplifiers according to the various embodiments of the present invention shown in FIGS. 5 to 7 can be achieved.

Figure 9:
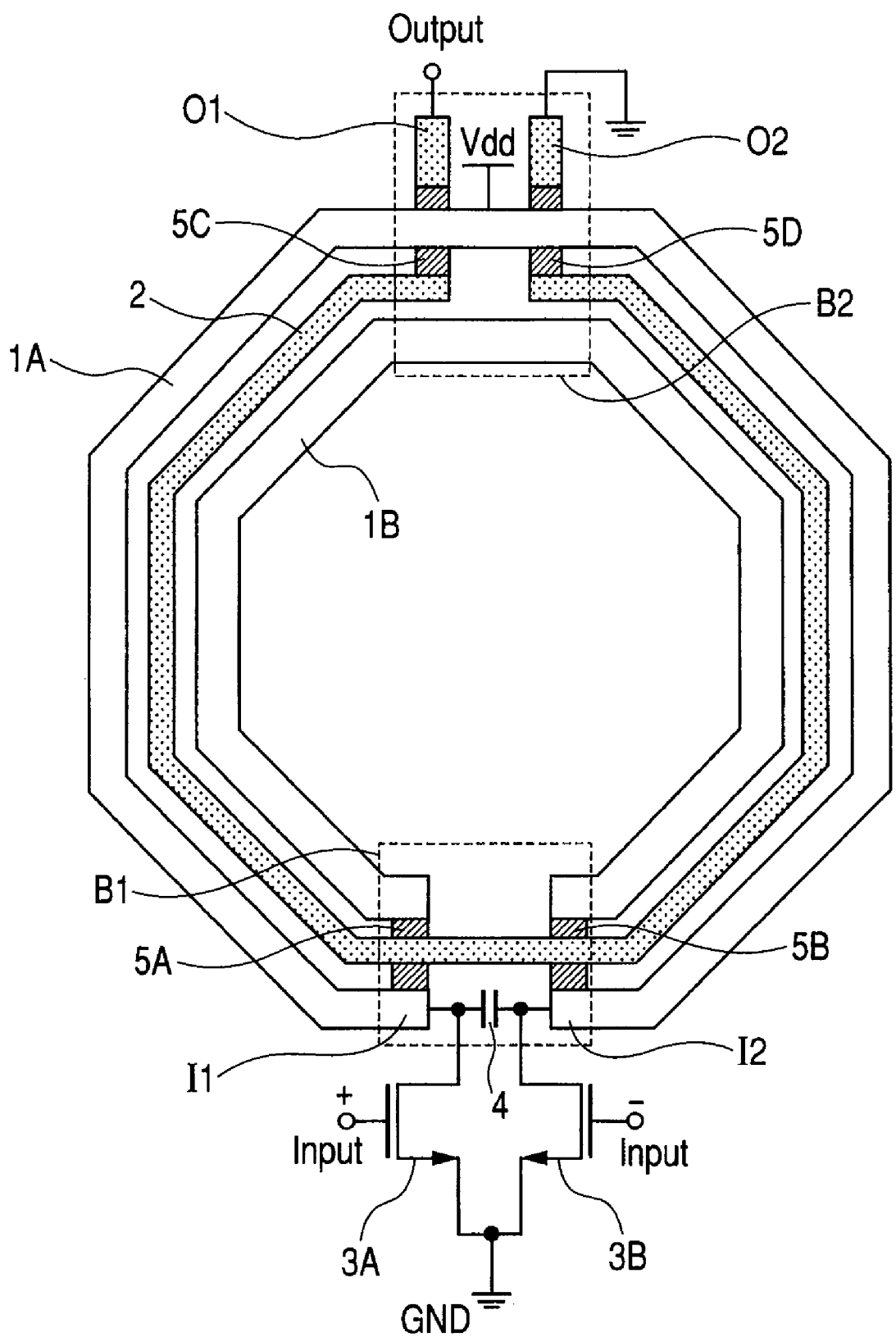
FIG. 9 is a view showing still another configuration of the RF power amplifier according to the embodiment of the present invention.

FIG. 9 is a view showing still another configuration of the RF power amplifier according to the embodiment of the present invention.

That is, the RF power amplifier shown in FIG. 9 is different from the RF power amplifier shown in FIG. 5 in the following point.

In the RF power amplifier shown in FIG. 9, the metal thin-film wire 2 as the metal strip of the secondary coil has one turn, instead of three turns, between the outer metal wire 1A and the inner metal wire 1B of the primary coil of the transformer. Accordingly, the number of turns of the metal thin-film wire 2 is one so that the ratio of turns (Turn Ratio) between the primary coil and the secondary coil is 1:1, and the impedance transformation ratio in the basic theory of the on-chip transformer as the output impedance matching circuit of the RF power amplifier is $1:1^2$. However, between the respective drains of the N-channel MOS transistors 3A and 3B of the one push-pull power amplification circuit, the two outer and inner metal wires 1A and 1B of the primary coil are coupled in parallel. As a result, the inductance of the primary coil is reduced to allow a reduction in the input impedance of the primary coil of the on-chip transformer. The present inventors have calculated the impedance transformation ratio of the RF power amplifier of FIG. 9 by electromagnetic field simulation, and found that an impedance transformation ratio of 1:2.1, which is more excellent than the value in the basic theory, is obtainable. The reason for this also results from the reduction of the input impedance of the primary coil formed of the two parallel-coupled metal wires 1A and 1B to one-half of an input impedance obtained in a normal case. In the RF power amplifier shown in FIG. 9 also, generally the same useful operation and effect as achieved with each of the RF power amplifiers according to the various embodiments of the present invention shown in FIGS. 5 to 7 can be achieved.

Figure 10:
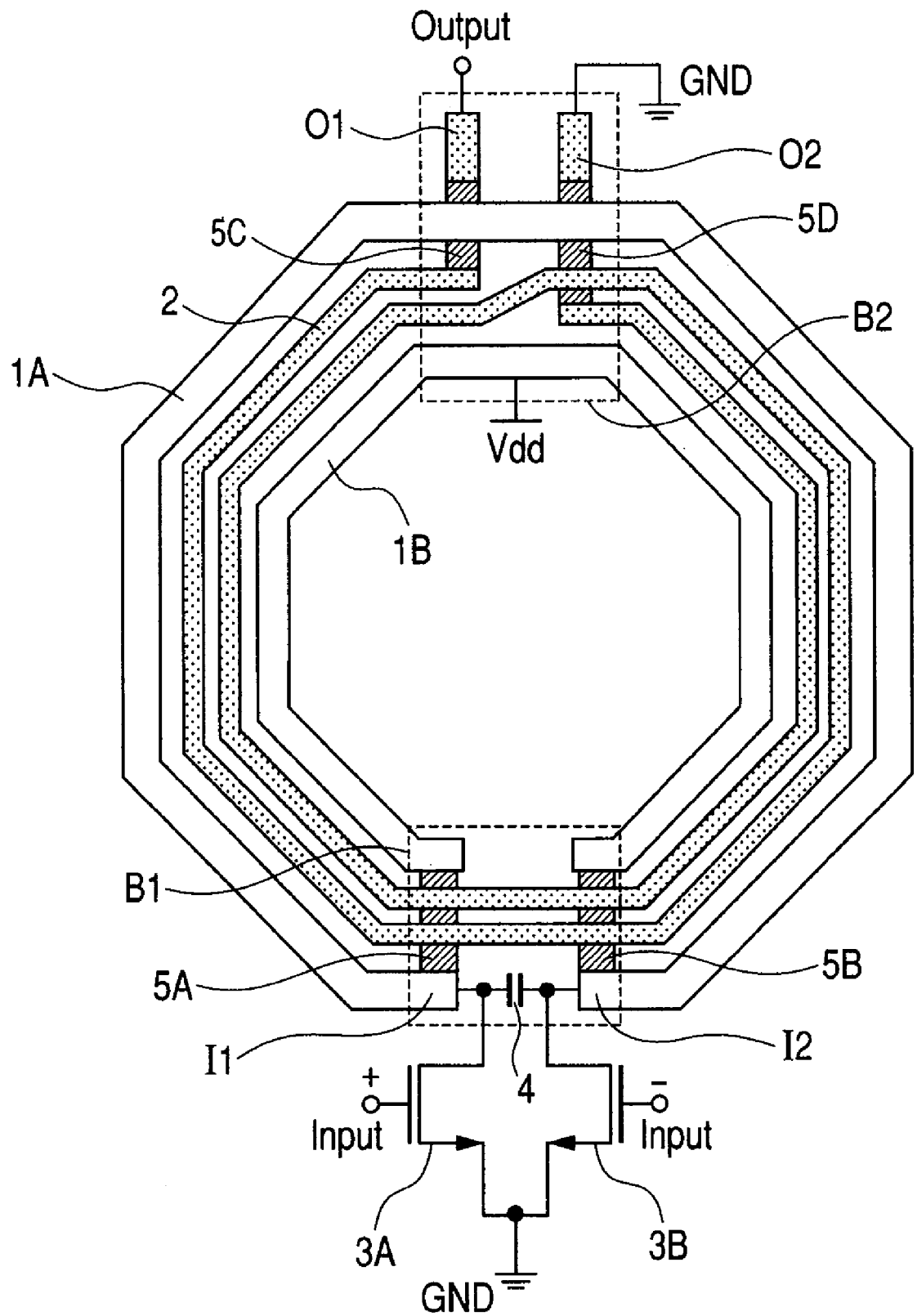
FIG. 10 is a view showing yet another configuration of the RF power amplifier according to the embodiment of the present invention.

FIG. 10 is a view showing yet another configuration of the RF power amplifier according to the embodiment of the present invention.

That is, the RF power amplifier shown in FIG. 10 is different from the RF power amplifier shown in FIG. 9 in the following point.

In the RF power amplifier shown in FIG. 10, the metal thin-film wire 2 as the metal strip of the secondary coil has two turns, instead of one turn, between the outer metal wire 1A and the inner metal wire 1B of the primary coil of the transformer. Accordingly, the number of turns of the metal thin-film wire 2 is two so that the ratio of turns (Turn Ratio) between the primary coil and the secondary coil is 1:2, and the impedance transformation ratio in the basic theory of the on-chip transformer as the output impedance matching circuit of the RF power amplifier is $1:2^2$. However, between the respective drains of the N-channel MOS transistors 3A and 3B of the one push-pull power amplification circuit, the two outer and inner metal wires 1A and 1B of the primary coil are coupled in parallel. As a result, the inductance of the primary coil is reduced to allow a reduction in the input impedance of the primary coil of the on-chip transformer. The present inventors have calculated the impedance transformation ratio of the RF power amplifier of FIG. 10 by electromagnetic field simulation, and found that an impedance transformation ratio of 1:5.7, which is more excellent than the value in the basic theory, is obtainable. The reason for this also results from the reduction of the input impedance of the primary coil formed of the two parallel-coupled metal wires 1A and 1B to one-half of an input impedance obtained in a normal case. In the RF power amplifier shown in FIG. 10 also, generally the same useful operation and effect as achieved with each of the RF power amplifiers according to the various embodiments of the present invention shown in FIGS. 5 to 7 can be achieved.

Monolithic RF Power Amplifier

FIG. 11 is a view showing a configuration of a monolithic RF power amplifier according to another embodiment of the present invention in which the transformer and the N-channel MOS transistors of the one push-pull power amplification circuit, each illustrated in FIG. 5, are integrated in a Si chip.

That is, in the monolithic RF power amplifier shown in FIG. 11, the transformer 11 for output impedance matching and the differential pair 3 of the MOS transistors 3A and 3B, each illustrated in FIG. 5, and a transformer 12 for input impedance matching are integrated in a Si chip 10. The Si chip 10 has been pellet-bonded onto a rectangular tab, and a plurality of external leads 13 to 16 have been formed around the rectangular tab. The plurality of external leads 13 to 16 and a plurality of bonding pads of the Si chip 10 are electrically coupled to each other by a plurality of bonding wires.

A differential pair of input signals supplied from the two external leads 16 are supplied to the respective gates of each of the pairs of MOS transistors in the differential pair 3 via the input impedance matching transformer 12, and a differential pair of output signals from the respective drains of the pair of MOS transistors in the differential pair 3 are supplied to the primary coil of the output impedance matching transformer 11. RF transmission differential output signals generated from the secondary coil of the output impedance matching transformer 11 can be supplied to an antenna mounted in a mobile phone terminal via the two external leads 13 and 14. In addition, the power supply voltage Vdd supplied via the external lead 15 disposed between the two external leads 13 and 14 can also be supplied to each of the respective midpoints of the outer and inner metal wires of the primary coil having the annular shape of the output impedance matching transformer 11. The external lead 15 disposed between the two external leads 13 and 14 has the function of reducing undesired crosstalk between the two external leads 13 and 14.

The transformers and the N-channel MOS transistors of the push-pull power amplification circuit which are integrated in the Si chip 10 of the monolithic RF power amplifier shown in FIG. 11 are not limited to the structures shown in FIG. 5. Any of the structures shown in FIGS. 6 to 10 can be integrated as the transformers and the N-channel MOS transistors of the push-pull power amplification circuit which are integrated in the Si chip 10 of the monolithic RF power amplifier shown in FIG. 11. Note that, over the surface of the Si chip 10 of the monolithic RF power amplifier shown in FIG. 11, a resin for providing mechanical and electrical protection and the prevention of the entrance of moisture has been formed.

RF Power Amplifier Module

FIG. 12 is a view showing a configuration of an RF power amplifier module according to still another embodiment of the present invention, in which the Si chip 10 having integrated therein the N-channel MOS transistors of the one push-pull power amplification circuit, and the output impedance matching transformer 11 illustrated in FIG. 9 are embedded.

That is, in the RF power amplifier module shown in FIG. 12, the differential pair 3 of the MOS transistors 3A and 3B and the transformer 12 for the input impedance matching have been integrated in the Si chip 10. In addition, over a printed substrate 17 of the RF power amplifier module, the Si chip 10, the transformer 11 for the output impedance matching illustrated in FIG. 9, chip capacitors 18A and 18B, and a metal thin-film inductor 19 have been formed.

In the case of forming a metal thin-film wire over the printed substrate 17, the formation of a minute pattern is more difficult than in the case of forming the metal thin-film wire over the Si chip 10. That is, in the case of forming the output impedance matching transformer 11 over the printed substrate 17, it is difficult to implement the secondary coils with two or more turns. Therefore, in the RF power amplifier module shown in FIG. 12, there is employed the on-chip transformer 11 as the output impedance matching circuit in which the secondary coil shown in FIG. 9 has one turn, and the ratio of turns between the primary coil and the secondary coil is 1:1. As a result, however, the on-chip transformer 11 has a slightly insufficient impedance transformation ratio so that an auxiliary output impedance matching circuit formed of passive elements which are the chip capacitor 18A and the metal thin-film inductor 19 is coupled to the output of the transformer 11. The auxiliary output impedance matching circuit functions also as a lowpass filter which reduces an unneeded harmonic component. Note that the chip capacitor 18B is for reducing the level of an odd-numbered harmonic in the push-pull power amplification circuit. Over the surface of the RF power amplifier module of FIG. 12, a resin for providing mechanical and electrical protection and the prevention of the entrance of moisture has been formed. A transformer which is mounted over the printed substrate 17 of the RF power amplifier module of FIG. 12 is not limited to the structure shown in FIG. 9. Any of the structures shown in FIGS. 5 to 8 and 10 can be mounted over the printed substrate 17 of the RF power amplifier module of FIG. 12. Note that, in FIG. 12, a plurality of vias 20, 21, 22A, and 22B are formed over the printed substrate 17, and the vias couple the upper layer wiring and lower layer wiring of the multilayer wiring to each other inside the printed substrate 17. The via 20 is used to obtain an output signal from the auxiliary output impedance matching circuit formed of the chip capacitor 18A and the metal thin-film inductor 19. The via 21 is used to supply the power supply voltage to the primary coil of the transformer 11. The vias 22A and 22B are used to couple one terminal of each of the chip capacitors 18A and 18B to a ground electrode at the back surface of the printed substrate 17.

FIG. 13 is a view showing a configuration of the RF power amplifier module according to yet another embodiment of the present invention having embedded therein the Si chip 10 in which the N-channel MOS transistors of the one push-pull power amplification circuit and the output impedance matching transformer 11 described in FIG. 9 are integrated.

The RF power amplifier module shown in FIG. 13 is different from the RF power amplifier module shown in FIG. 12 in the following point.

That is, in the RF power amplifier module shown in FIG. 13, the differential pair 3 of the MOS transistors 3A and 3B, the input impedance matching transformer 12, the output impedance matching transformer 11 illustrated in FIG. 9, and MIM capacitors 18C and 18D are integrated in the Si chip 10. Further, over the printed substrate 17 of the RF power amplifier module, the Si chip 10 and the metal thin-film inductor 19 are formed. The metal thin-film inductor 19 over the printed substrate 17 and the MIM capacitor 18C over the Si chip 10 cooperate with the auxiliary output impedance matching circuit to function as a lowpass filter which reduces an unneeded harmonic component. Note that the MIM capacitor 18D is for reducing the level of an odd-numbered harmonic in the push-pull power amplification circuit. Over the surface of the RF power amplifier module of FIG. 13, a resin for providing mechanical and electrical protection and the prevention of the entrance of moisture has been formed. A transformer which is integrated in the Si chip 10 mounted over the printed substrate 17 of the RF power amplifier module of FIG. 13 is not limited to the structure shown in FIG. 9. Any of the structures shown in FIGS. 5 to 8 and 10 can be integrated in the Si chip 10 mounted over the printed substrate 17 of the RF power amplifier module of FIG. 13.

FIG. 14 is a view showing a configuration of the RF power amplifier module according to still another embodiment of the present invention having embedded therein a GaAs chip 41 in which a high-breakdown-voltage npn-type heterojunction bipolar transistor (HBT) 40 is integrated as each of the transistors of the push-pull power amplification circuit, and the output impedance matching transformer 11 illustrated in FIG. 9.

The RF power amplifier module shown in FIG. 14 is different from the RF power amplifier module shown in FIG. 12 in that the Si chip 10 of FIG. 12 in which the N-channel MOS transistors are integrated has been replaced with the GaAs compound semiconductor semi-insulating chip 41 in which the HBT 40 is integrated, and otherwise identical thereto.

LDMOS Transistor

Figure 15:
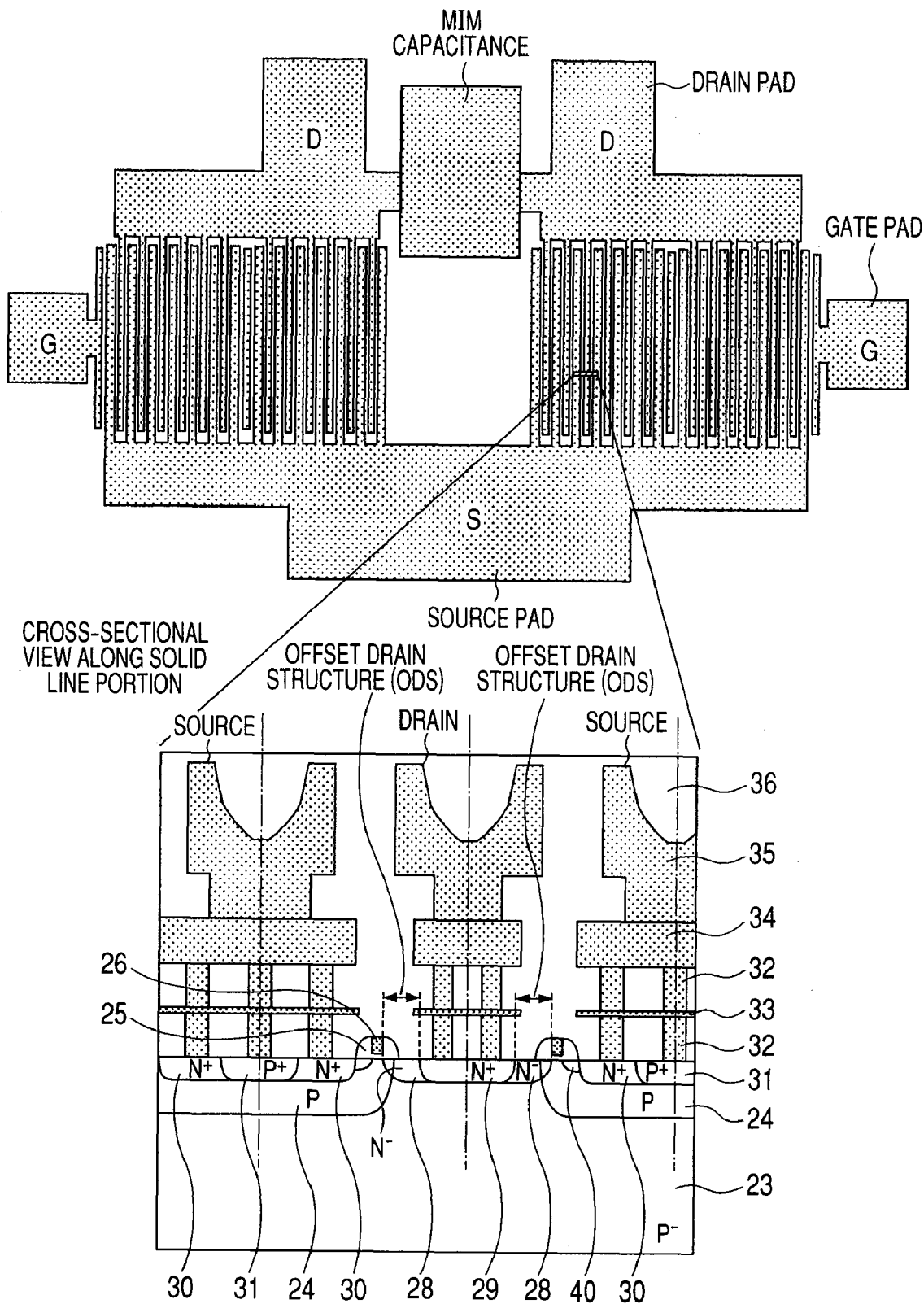
FIG. 15 is a view showing a configuration of an LDMOS transistor used in each of the push-pull power amplification circuits of the RF power amplifiers according to the various embodiments of the present invention shown in FIGS. 5 to 13.

FIG. 15 is a view showing a configuration of an LDMOS transistor used in the push-pull power amplification circuit of any of the RF power amplifiers according to the various embodiments of the present invention shown in FIGS. 5 to 13.

In the upper plan view of FIG. 15, two LDMOS transistors and a MIM capacitor between the respective drain electrodes D thereof are shown. The MIM capacitor reduces the level of an odd-numbered harmonic. To the respective gate electrodes G of the two LDMOS transistors, a differential pair of input signals are supplied. To the common source electrode S of the two LDMOS transistors, a ground voltage is supplied. Note that the two LDMOS transistors have a finger electrode structure in which the plurality of source electrodes S and the plurality of drain electrodes D are interdigitated with each other.

In the lower cross-sectional view of FIG. 15, a cross-sectional structure of a part of the LDMOS transistor located on the right-hand side of the upper plan view of FIG. 15 is shown.

Each of the two LDMOS transistors includes, e.g., a P-type (low-impurity-concentration) Si substrate 23, a P-type well 24, a Si oxide film 25, a polycrystalline Si film (gate electrode) 26, an N-type Si layer (low-impurity-concentration source diffusion layer) 40, an N⁻-type Si layer (low-impurity-concentration drain diffusion layer) 28, an N⁻-type Si layer (high-impurity-concentration drain diffusion layer) 29, an N⁺-type Si layer (high-impurity-concentration source diffusion layer) 30, a P⁺-type Si layer 31, metal films 32 to 35, and an insulating film 36. The drain 28 and source 31 of each of the LDMOS transistors are symmetrically formed with respect to the gate 26.

In the LDMOS transistor shown in the lower cross-sectional view of FIG. 15, the low-impurity-concentration drain diffusion layer 28 and an offset drain structure ODS are formed between the gate electrode 26 and the high-impurity-concentration drain diffusion layer 29. The Si substrate (p-type Si substrate 23) is assumed to have a low impurity concentration, and a high resistivity. Accordingly, the LDMOS transistor shown in FIG. 15 is assumed to have a breakdown voltage higher than that of a short-channel MOS transistor formed by a CMOS manufacturing process. In addition, because the drain output capacitance of the LDMOS transistor is reduced, and the channel resistance of a source-drain current path has a relatively large value, the output impedance also has a relatively large value.

The LDMOS transistor shown in the lower cross-sectional view of FIG. 15 is different from a typical LDMOS transistor in that the Si substrate 23 has a low impurity concentration, and a high resistivity.

Figure 16:
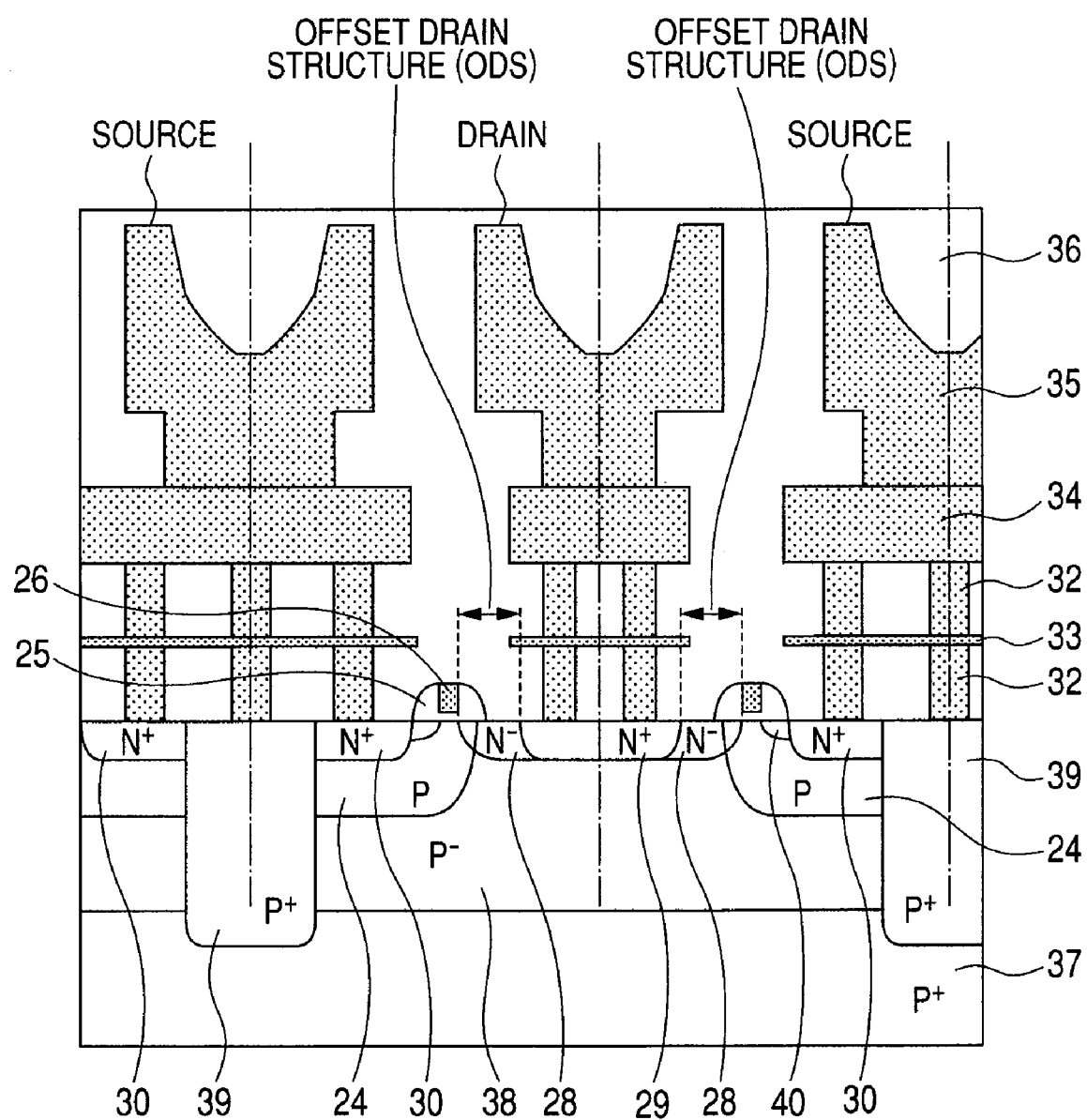
FIG. 16 is a view showing a structure of a typical LDMOS transistor for a comparison with the LDMOS transistor shown in the lower cross-sectional view of FIG. 15.

FIG. 16 is a view showing a structure of a typical LDMOS transistor for a comparison with the LDMOS transistor shown in the lower cross-sectional view of FIG. 15.

In the LDMOS transistor having a typical structure shown in FIG. 16, the P⁻-type (low-impurity-concentration) Si substrate 23 of FIG. 15 has been replaced with a P⁻-type (low-impurity-concentration) Si layer 38 of FIG. 16, and a P⁺-type Si substrate 37 is formed under the P⁻-type Si layer 38. Additionally, in the LDMOS transistor having the typical structure shown in FIG. 16, the source electrode is electrically coupled to the P⁻-type polycrystalline Si layer 39 that has been formed deep so as to extend through the P⁻-type Si layer 38, and reach the P⁺-type Si substrate 37. The LDMOS transistor having the typical structure shown in FIG. 16 is mounted in an RF power amplifier module, and the P⁺-type Si substrate 37 is coupled to the ground electrode of the RF power amplifier module which also has the function of a heat radiator plate. The ground electrode of the RF power amplifier module which also has the function of the heat radiator plate is coupled to the ground wire of the circuit substrate of a mobile phone terminal. As a result, when the LDMOS transistor having the typical structure shown in FIG. 16 is used as a source-grounded power transistor in the final amplification stage of the RF power amplifier module, fluctuations in the ground voltage of the source electrode in which a source current having a large value flows are reduced, and heat radiation from the RF power amplifier module can be improved.

By contrast, in the push-pull power amplification circuit of any of the RF power amplifiers according to the various embodiments of the present invention shown in FIGS. 5 to 13 in which the LDMOS transistor shown in the lower cross-sectional view of FIG. 15 is used, the two LDMOS transistors shown in FIG. 15 perform differential operations. As a result, an alternating current flowing in the common source of the two LDMOS transistors are mutually cancelled out so that the alternating current flowing into or out of the common source of the two LDMOS transistors becomes zero. Therefore, in the RF power amplifier module in which the two LDMOS transistors shown in FIG. 15 are mounted as the source-grounded power transistors in the final amplification stage, sufficient grounding is achieved merely by coupling the common source of the two LDMOS transistors to the grounding wire of the circuit substrate of a mobile phone terminal via, e.g., an external lead. This is because the alternating current flowing into or out of the common source of the two LDMOS transistors becomes zero, and a current flowing in the external lead becomes zero. However, in that case, it is suggested to couple the P⁻-type (low-impurity-concentration) Si substrate 23 formed with the LDMOS transistor shown in FIG. 15 to the heat radiator plate of the RF power amplifier module, and thereby improve heat radiation from the RF power amplifier module.

In addition, since the P⁻-type Si substrate 23 formed with the LDMOS transistor shown in FIG. 15 has a low impurity concentration, and a high resistivity, it is possible to reduce power loss when the on-chip transformer in which the two LDMOS transistors are coupled to the P⁻-type Si substrate 23 is formed. For example, a case is assumed where an on-chip transformer having any of the structures of FIGS. 5 to 10 is formed in the P⁻-type Si substrate 23 shown in FIG. 15. Under the influence of a magnetic field at the center of the annular shape of the on-chip transformer, an eddy current may flow around the magnetic field at the center. In the LDMOS transistor shown in FIG. 15, the P$^-$-type Si substrate 23 has a low impurity concentration, and a high resistivity so that the value of the eddy current is small, and power loss due to the eddy current is small. However, in the LDMOS transistor having the typical structure shown in FIG. 16, the P$^+$-type Si substrate 37 has a high impurity concentration, and a low resistivity so that the value of the eddy current is large, and power loss due to the eddy current is also large.

High-Breakdown-Voltage Heterojunction Bipolar Transistor

FIG. 17 is a view showing a configuration of a high-breakdown-voltage npn-type heterojunction bipolar transistor (HBT) used in the push-pull power amplification circuit of the RF power amplifier according to the still another embodiment of the present invention shown in FIG. 14.

In the upper plan view of FIG. 17, two HBTs and a MIM capacitor between the respective collector electrodes C thereof are shown, and the MIM capacitor reduces the level of an odd-numbered harmonic. To the respective base electrodes B of the two HBTs, a differential pair of input signals are supplied. To each of the respective emitter electrodes E of the two HBTs, a ground voltage is supplied. Note that the two HBTs have a finger electrode structure in which the plurality of emitter electrodes E and the plurality of collector electrodes C are interdigitated with each other.

In the lower cross-sectional view of FIG. 17, a cross-sectional structure of a part of the HBT located on the left-hand side of the upper plan view of FIG. 17 is shown.

The HBT is formed over a GaAs compound semiconductor semi-insulating substrate 42, and includes an N$^+$-type subcollector layer 43, an N$^-$-type collector layer 44, a P$^+$-type GaAs base layer 45, an N-type AlGaAs emitter layer 46, and an N$^+$-type GaAs ohmic layer 47. The HBT also includes a collector electrode 48, a base electrode 49, an emitter electrode 50, a ground electrode 51 at the back surface of the semi-insulating substrate 42, and a via hole 52. In particular, the emitter electrode 50 is assumed to be able to be coupled to the ground voltage via the via hole 52 and the ground electrode 51. It is also assumed that the N$^-$-type collector layer 44 of the HBT has a low impurity concentration, and the HBT has a high breakdown voltage. In addition, because the collector output capacitance of the HBT is reduced, and the resistance of an emitter-collector current path has a relatively large value, the output impedance also has a relatively large value.

Specific RF Power Amplifier Module

Figure 18:
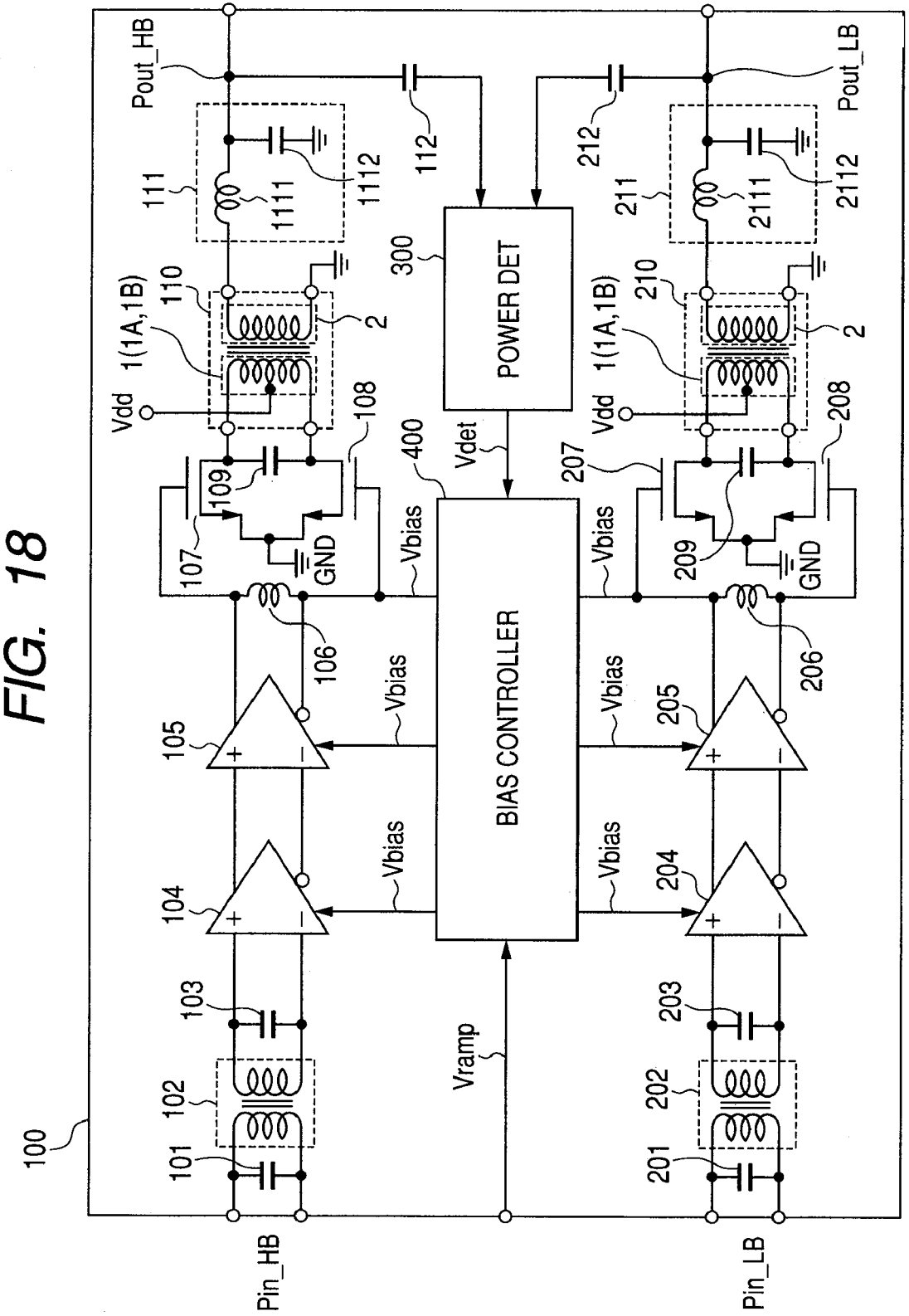
FIG. 18 is a view showing a configuration of a specific RF power amplifier module used in a mobile phone terminal to which any of the various embodiments of the present invention shown in FIGS. 5 to 17 described above is applied.

FIG. 18 is a view showing a configuration of a specific RF power amplifier module used in a mobile phone terminal to which any of the various embodiments of the present invention shown in FIGS. 5 to 17 described above is applied.

To an RF power amplifier module 100 shown in FIG. 18, high-band-side RF transmission input signals Pin_HB in the DCS 1800/PCS 1900 bands and low-band-side RF transmission input signals Pin_LB in the GSM 850/GSM 900 bands are supplied.

The high-band-side RF transmission input signals Pin_HB are supplied to both ends of a capacitor 101 and to both ends of the primary coil of an input matching circuit 102. RF signals generated at both ends of the secondary coil of the input matching circuit 102 and at both ends of a capacitor 103 are amplified by a first drive amplification stage 104 and by a second drive amplification stage 105. A differential pair of amplified signals from the second drive amplification stage 105 are supplied between both ends of a coil 106 and the respective gates of N-channel LDMOS transistors 107 and 108 of a final-stage push-pull power amplification circuit. The differential pair of amplified signals generated between the respective drains of the N-channel LDMOS transistors 107 and 108 of the final-stage push-pull power amplification circuit is supplied to both ends of a capacitor 109 and to the primary coil 1 (1A and 1B) of a transformer 110, and the power supply voltage Vdd is supplied to the midpoint of the primary coil 1. As the transformer 110, any of the transformers according to the various embodiments of the present invention shown in FIGS. 5 to 10 can be used. To the secondary coil 2 of the transformer 110, the input terminal of an auxiliary output impedance matching circuit 111 formed of passive elements which are an inductor 1111 and a capacitor 1112 is coupled. From the output terminal of the output impedance matching circuit 111, a high-band-side RF transmission output signal Pout_HB is generated. A part of the high-band-side RF transmission output signal Pout_HB is supplied to the first input terminal of a power detector 300 via a capacitor 112.

The low-band-side RF transmission input signals Pin_LB are supplied to both ends of a capacitor 201 and to both ends of the primary coil of an input matching circuit 202. RF signals generated at both ends of the secondary coil of the input matching circuit 202 and at both ends of a capacitor 203 are amplified by a first drive amplification stage 204 and by a second drive amplification stage 205. A differential pair of amplified signals from the second drive amplification stage 205 is supplied between both ends of a coil 206 and the respective gates of N-channel LDMOS transistors 207 and 208 of a final-stage push-pull power amplification circuit. The differential pair of amplified signals generated between the respective drains of the N-channel LDMOS transistors 207 and 208 of the final-stage push-pull power amplification circuit is supplied to both ends of a coil 209 and to the primary coil 1 (1A and 1B) of a transformer 210, and the power supply voltage Vdd is supplied to the midpoint of the primary coil 1. As the transformer 210, any of the transformers according to the various embodiments of the present invention shown in FIGS. 5 to 10 can be used. To the secondary coil 2 of the transformer 210, the input terminal of an auxiliary output impedance matching circuit 211 formed of passive elements which are an inductor 2111 and a capacitor 2112 is coupled. From the output terminal of the output impedance matching circuit 211, a low-band-side RF transmission output signal Pout_LB is generated. A part of the low-band-side RF transmission output signal Pout_LB is supplied to the second input terminal of the power detector 300 via a capacitor 212.

A bias control circuit 400 compares the level of a transmission power control signal Vramp with the level of a power detection signal Vdet generated from the output of the power detector 300 to control the gain of the RF power amplifier such that the level of the power detection signal Vdet is equal to the level of the transmission power control signal Vramp. The control of the gain of the RF power amplifier is controlled based on the level of a bias voltage Vbias generated from the bias control circuit 400.

The power detector 300 and the bias control circuit 400 are formed by, e.g., a CMOS manufacturing process, and the active elements thereof are primarily formed of short-channel MOS transistors. Since the short-channel MOS transistors are lower in input power and input voltage supplied thereto than the N-channel LDMOS transistors 107, 108, 207, and 208 coupled to the transformers 110 and 210, a low-breakdown-voltage structure can be employed. Therefore, in consideration of chip size, a high-speed operation characteristic, and the like, short-size channel MOS transistors having gate lengths smaller than those of the N-channel LDMOS transistors 107, 108, 207, and 208 are employed.

It has been assumed that the push-pull power amplification circuit is formed of N-channel LDMOS transistors, and the power detector 300 and the bias control circuit 400 are formed of short-channel MOS transistors. However, the present invention is not limited thereto. As active elements used in the push-pull power amplification circuit, transistors having breakdown voltages higher than those of active elements used in the power detector 300 and the bias control circuit 400 are preferably employed.

While the invention achieved by the present inventors has been specifically described heretofore based on the embodiments thereof, the present invention is not limited thereto. It will be easily appreciated that various modification and changes can be made in the invention without departing from the gist thereof.

For example, each of the RF power amplifiers according to the various embodiments of the present invention is not only usable as an RF power amplifier mounted in a mobile phone terminal, but also usable in a wide range as an RF power amplifier mounted in any of various RF communication apparatus such as a wireless LAN.

What is claimed is:

1. An RF power amplifier comprising:
a first transistor and a second transistor each being an active device of a push-pull power amplification circuit; and
a transformer being an output matching circuit of the push-pull power amplification circuit,
wherein a non-inverted input signal and an inverted input signal can be supplied respectively to an input terminal of the first transistor and an input terminal of the second transistor,
wherein the transformer has a primary coil and a secondary coil which are magnetically coupled to each other,
wherein a first end and a second end of the primary coil of the transformer are respectively coupled to an output terminal of the first transistor and an output terminal of the second transistor,
wherein an output signal can be generated from a first end and a second end of the secondary coil of the transformer, and
wherein the primary coil of the transformer includes at least a first coil and a second coil which are coupled in parallel between the output terminal of the first transistor and the output terminal of the second transistor, and are each magnetically coupled to the secondary coil of the transformer,
wherein the primary coil and the secondary coil of the transformer are respective metal thin-film wires having respective annular shapes, and each are disposed in a flat shape over a surface of a substrate, and
wherein each of the first coil and the second coil of the primary coil of the transformer has a symmetrical shape.

2. An RF power amplifier according to claim 1,
wherein the primary coil of the transformer is supplied with a power supply voltage at a position on an imaginary line of symmetry of the primary coil.

3. An RF power amplifier according to claim 1,
wherein the metal thin-film wire forming each of the first coil and the second coil, of the primary coil of the transformer, has a width larger than a width of the metal thin-film wire forming the secondary coil of the transformer.

4. An RF power amplifier according to claim 2,
wherein the metal thin-film wire forming the primary coil of the transformer and the metal thin-film wire forming the secondary coil of the transformer are formed around the respective annular shapes, and
wherein the primary coil and the secondary coil of the transformer are set to a predetermined ratio of turns to allow the transformer to execute an output matching operation in accordance with an impedance transformation ratio determined by the ratio of turns.

5. An RF power amplifier according to claim 4,
wherein the first and second coils of the primary coil of the transformer are respectively of an outer metal thin-film wire and an inner metal thin-film wire,
each having the annular shape, and
wherein the secondary coil of the transformer is a middle metal thin-film wire disposed between the outer metal thin-film wire and the inner metal thin-film wire.

6. An RF power amplifier according to claim 5,
wherein the secondary coil of the transformer formed of the middle metal thin-film wire between the outer metal thin-film wire and the inner metal thin-film wire has a plural number of turns.

7. An RF power amplifier according to claim 4,
wherein the first coil and the second coil of the primary coil, and the secondary coil of the transformer have a multilayer wiring structure disposed over the surface of the substrate, and
wherein, in the multilayer wiring structure, the secondary coil of the transformer is interposed between the first coil and the second coil.

8. An RF power amplifier according to claim 4,
wherein the substrate is a semiconductor chip,
wherein the first transistor and the second transistor are disposed in the semiconductor chip, and
wherein the transformer is disposed as an on-chip transformer on the semiconductor chip.

9. An RF power amplifier according to claim 4,
wherein the substrate having the transformer disposed thereon is a wiring substrate,
wherein the first transistor and the second transistor are disposed in a semiconductor chip, and
wherein the transformer disposed over the wiring substrate is electrically coupled to each of the first transistor and the second transistor by a coupling wire.

10. An RF power amplifier according to claim 4,
wherein each of the first transistor and the second transistor is a MOS-type transistor.

11. An RF power amplifier according to claim 2,
wherein the first end and the second end of the primary coil of the transformer which are coupled to the first and second transistors and the first end and the second end of the secondary coil of the transformer between which the output signal can be generated are disposed at mutually opposing locations along the annular shapes.

12. An RF power amplifier comprising:
a first transistor and a second transistor, each being an active device of a push-pull power amplification circuit; and
a transformer being an output matching circuit of the push-pull power amplification circuit, wherein a non-inverted input signal and an inverted input signal can be supplied respectively to an input terminal of the first transistor and an input terminal of the second transistor, wherein the transformer has a primary metal thin-film wire and a secondary metal thin-film wire, wherein the primary metal thin-film wire and the secondary metal thin-film wire are magnetically coupled to each other, and have respective annular shapes each disposed flat over a surface of a substrate, wherein a first end of the primary metal thin-film wire of the transformer is coupled to an output terminal of the first transistor, while a second end of the primary metal thin-film wire of the transformer is coupled to an output terminal of the second transistor, wherein an output signal can be generated from a first end and a second end of the secondary metal thin-film wire of the transformer, wherein the first end and the second end of the primary metal thin-film wire of the transformer and the first end and the second end of the secondary metal thin-film wire of the transformer are respectively disposed in a first portion and a second portion of each of the annular shapes, wherein, in the first portion of the annular shape, the first end and the second end of the primary metal thin-film wire of the transformer are disposed proximate to each other while, in the second portion of the annular shape, the first end and the second end of the secondary metal thin-film wire of the transformer are disposed proximate to each other, wherein the primary metal thin-film wire of the transformer includes at least a first wire and a second wire which are coupled in parallel between the output terminal of the first transistor and the output terminal of the second transistor, and each are magnetically coupled to the secondary metal thin-film wire, wherein the first wire and the second wire, of the primary metal thin-film wire, and the secondary metal thin-film wire of the transformer all have symmetrical shapes with respect to an imaginary line coupling the first portion and the second portion to each other.

13. An RF power amplifier according to claim 12,
wherein the primary metal thin-film wire of the transformer is supplied with a power supply voltage at a position on an imaginary line of symmetry of the primary metal thin-film wire of the transformer having a symmetrical shape.

14. An RF power amplifier according to claim 13,
wherein the primary metal thin-film wire of the transformer has a width larger than a width of the secondary metal thin-film wire of the transformer.

15. An RF power amplifier according to claim 14,
wherein the first portion and the second portion of each of the annular shapes oppose each other.

16. An RF power amplifier according to claim 14,
wherein the primary metal thin-film wire of the transformer and the secondary metal thin-film wire of the transformer are disposed around the respective annular shapes, and wherein the primary metal thin-film wire of the transformer and the secondary metal thin-film wire of the transformer are set to a predetermined ratio of turns to allow the transformer to execute an output matching operation in accordance with an impedance transformation ratio determined by the ratio of turns.

17. An RF power amplifier according to claim 13,
wherein the number of turns of the secondary metal thin-film wire of the transformer is set to an integral multiple of the number of turns of the primary metal thin-film wire of the transformer.

18. An RF power amplifier according to claim 12,
wherein the first wire and the second wire of the primary metal thin-film wire of the transformer are respectively an outer metal thin-film wire and an inner metal thin-film wire, each having respective annular shapes, and wherein the secondary metal thin-film wire of the transformer is a middle metal thin-film wire disposed between the outer metal thin-film wire and the inner metal thin-film wire.

19. An RF power amplifier according to claim 18,
wherein the secondary metal thin-film wire has a plural number of turns.

20. An RF power amplifier according to claim 17,
wherein the first wire and the second wire of the primary metal thin-film wire, and the secondary metal thin-film wire have a multilayer wiring structure disposed over the surface of the substrate, and wherein, in the multilayer wiring structure, the secondary metal thin-film wire of the transformer is interposed between the first wire and the second wire.

21. An RF power amplifier according to claim 17,
wherein the substrate is a semiconductor chip,
wherein the first transistor and the second transistor are disposed in the semiconductor chip, and
wherein the transformer is disposed as an on-chip transformer on the semiconductor chip.

22. An RF power amplifier according to claim 17,
wherein the substrate having the transformer disposed thereon is a wiring substrate,
wherein the first transistor and the second transistor are disposed in a semiconductor chip, and
wherein the transformer disposed on the wiring substrate is electrically coupled to each of the first transistor and the second transistor which are disposed in the semiconductor chip by a coupling wire.

23. An RF power amplifier according to claim 17,
wherein each of the first transistor and the second transistor is a MOS-type transistor.

24. An RF power amplifier according to claim 1, wherein the first coil of the primary coil is entirely disposed outside of a periphery of the second coil of the primary coil.

25. An RF power amplifier according to claim 1, wherein the first coil and the second coil, of the primary coil, are symmetric about a same line of symmetry.

26. An RF power amplifier according to claim 1, wherein the first coil and the second coil, of the primary coil, are formed in a same plane.

* * * * *